(12) United States Patent
Kim et al.

(10) Patent No.: US 11,791,260 B2
(45) Date of Patent: Oct. 17, 2023

(54) CONTACTS FOR TWISTED CONDUCTIVE LINES WITHIN MEMORY ARRAYS

(71) Applicant: Micron Technology, Inc., Boise, ID (US)

(72) Inventors: Byung Yoon Kim, Boise, ID (US); Sangmin Hwang, Boise, ID (US); Kyuseok Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 273 days.

(21) Appl. No.: 17/165,276

(22) Filed: Feb. 2, 2021

(65) Prior Publication Data

US 2022/0246525 A1 Aug. 4, 2022

(51) Int. Cl.
*H01L 23/528* (2006.01)
*H01L 21/768* (2006.01)
*H01L 23/522* (2006.01)
*H10B 12/00* (2023.01)

(52) U.S. Cl.
CPC .... *H01L 23/5283* (2013.01); *H01L 21/76816* (2013.01); *H01L 21/76877* (2013.01); *H01L 23/5226* (2013.01); *H10B 12/30* (2023.02)

(58) Field of Classification Search
CPC ............... H01L 23/528; H01L 23/5283; H01L 23/5226; H01L 21/76816; H01L 21/76877; H01L 21/76802; H01L 29/7926; H10N 70/826; H10B 12/485; H10B 12/482; H10B 12/488
See application file for complete search history.

(56) References Cited

U.S. PATENT DOCUMENTS

| | | | |
|---|---|---|---|
| 10,153,283 B2 * | 12/2018 | Kim | H10B 12/033 |
| 10,607,995 B2 | 3/2020 | Roberts et al. | |
| 11,191,155 B1 * | 11/2021 | Zhang | H05K 3/30 |
| 2011/0156122 A1 * | 6/2011 | Fastow | H10B 69/00 257/E21.409 |
| 2018/0323200 A1 | 11/2018 | Tang et al. | |
| 2019/0103406 A1 | 4/2019 | Tang et al. | |

(Continued)

OTHER PUBLICATIONS

U.S. Appl. No. 16/204,224, entitled, "Memory Arrays," filed Nov. 29, 2018, 43 pages.

*Primary Examiner* — Jaehwan Oh
*Assistant Examiner* — John M Parker
(74) *Attorney, Agent, or Firm* — Brooks, Cameron & Huebsch, PLLC

(57) ABSTRACT

Devices, systems, and methods for forming twisted conductive lines are described herein. One method includes: forming a first row and a second row of a first number of vertical conductive line contacts, the vertical contacts in each row are arrayed in a first horizontal direction and the first row is spaced from the second row in a second horizontal direction; forming a number of conductive lines with curved portions, each conductive line making contact with alternating conductive line contacts of the first and second rows of the first number of vertical conductive line contacts; and forming a second number of conductive lines with one or more curved portions, each conductive line making contact with the remaining ones of the conductive line contacts of the first and second rows of the first number of vertical conductive line contacts that have not been contacted by the first number of conductive lines.

20 Claims, 13 Drawing Sheets

(56) References Cited

U.S. PATENT DOCUMENTS

| | | |
|---|---|---|
| 2019/0164985 A1 | 5/2019 | Lee et al. |
| 2020/0098773 A1* | 3/2020 | Kaneko ................. H10B 41/10 |
| 2020/0098787 A1* | 3/2020 | Kaneko ................. H10B 41/27 |
| 2021/0074578 A1* | 3/2021 | Chou ................... H01L 21/7682 |
| 2021/0091073 A1* | 3/2021 | Su ...................... H01L 21/76895 |
| 2021/0091089 A1* | 3/2021 | Ho ....................... H10B 12/485 |
| 2022/0051992 A1* | 2/2022 | Hsu ..................... H01L 23/5328 |
| 2022/0059557 A1* | 2/2022 | Kajiwara ............. H01L 29/7926 |

* cited by examiner

CONTACTS FOR TWISTED CONDUCTIVE LINES WITHIN MEMORY ARRAYS

TECHNICAL FIELD

The present disclosure relates generally to memory devices, and more particularly to forming contacts for twisted conductive lines within arrays of vertically stacked memory cells of a three-dimensional (3D) semiconductor memory device.

BACKGROUND

Memory is often implemented in electronic systems, such as computers, cell phones, hand-held devices, etc. There are many different types of memory, including volatile and non-volatile memory. Volatile memory may require power to maintain its data and include random-access memory (RAM), dynamic random-access memory (DRAM), static random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell0 by an access line coupled to the access transistor. The capacitor can store a charge corresponding to a data value of a respective cell (e.g., a logic "1" or "0").

DETAILED DESCRIPTION

Figure 1A:
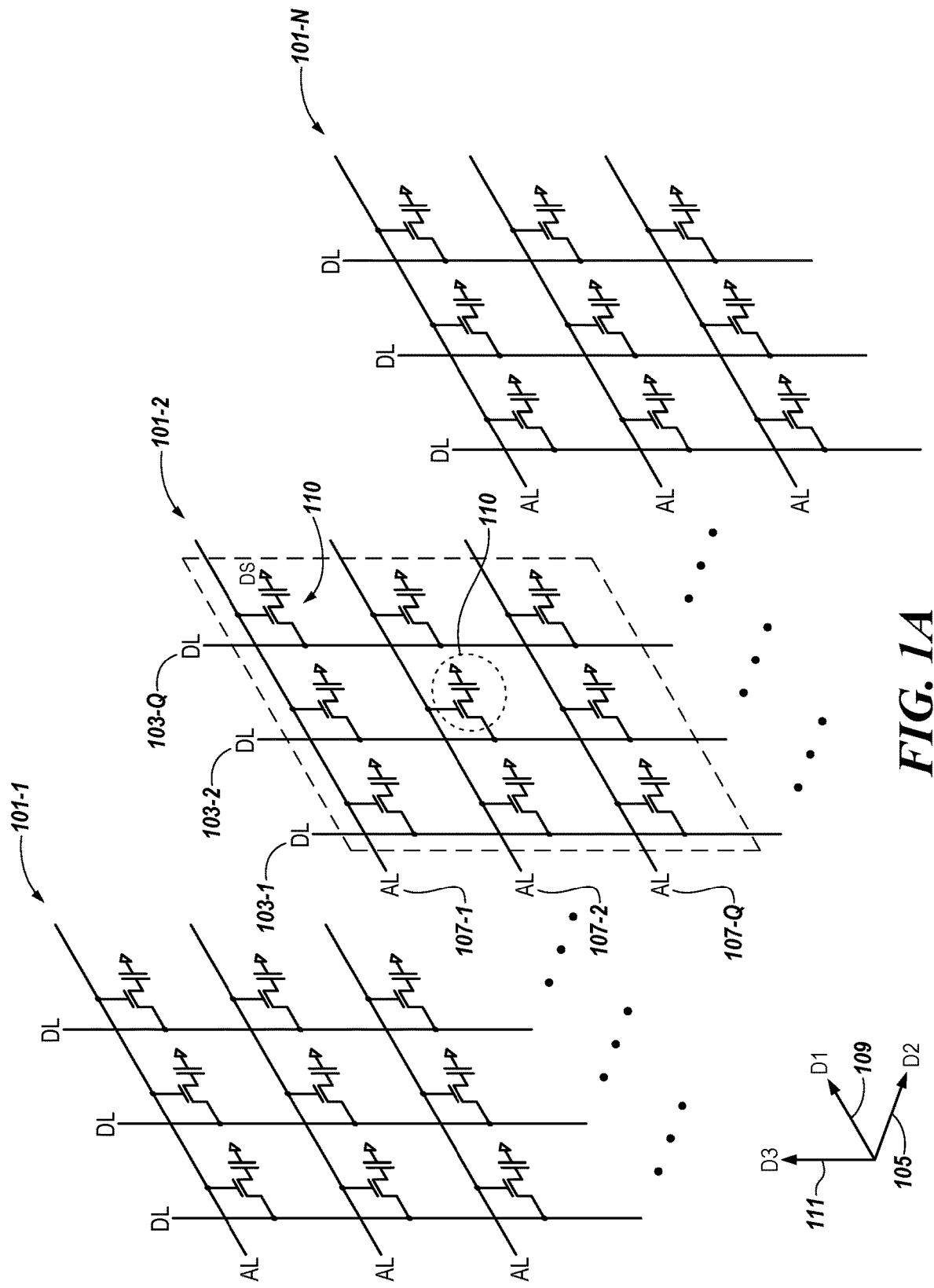
FIG. 1A is a schematic illustration of a vertical three-dimensional (3D) memory in accordance a number of embodiments of the present disclosure.

Embodiments of the present disclosure describe contacts for twisted conductive lines within memory arrays.

In vertically stacked memory array structures, it may be advantageous to place one or more conductive lines (e.g., bit lines, word lines, access lines, digit lines) near another conductive line to ease spatial constraints. This also allows for an improved contact pattern for connecting vertical contacts that couple the conductive lines to underlying circuitry, such as sense amplifiers. However, doing so often causes parasitic capacitance between the two conductive lines, which in turn results in noise experienced by sensing portions of the semiconductor memory device (e.g., a sense amplifier). Forming the conductive lines in a twisted manner can reduce such capacitance and noise. However, minimizing the space between twisted conductive lines formed in this manner can be challenging.

However, as disclosed in the embodiments of the present disclosure, it is possible to form twisted conductive lines using methods that minimize space, thus improving the overall design of the semiconductor memory device. For example, the distance between conductive line contacts in a horizontal direction can be reduced. Embodiments of the present disclosure describe systems, methods, and apparatuses for easing spatial constraints of a portion of a semiconductor memory device when forming twisted conductive lines.

This may be accomplished, for example, by first forming a number of horizontal rows of vertical lower conductive contacts, with each pair of rows resembling a curved or sinusoid shape, and forming a lower conductive line onto each pair of horizontal rows. Dielectric materials may then be deposited over and around the lower conductive lines and selectively etched and filled to form rows of upper conductive contacts aligned with the rows of lower conductive contacts. The upper conductive contacts may be greater in length than the lower conductive contacts. Thus, conductive lines formed onto the upper conductive contacts may lie above the lower conductive lines already formed.

Advantages to the systems, apparatuses, and methods described herein can include eased spatial constraints, improved accuracy in conductive line formation, and reduced noise.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 2A, and a similar element may be referenced as 204 in FIG. 2B. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

FIG. 1A is a block diagram of an apparatus in accordance with a number of embodiments of the present disclosure. FIG. 1A illustrates a circuit diagram showing a cell array of a three dimensional (3D) semiconductor memory device according to embodiments of the present disclosure. FIG. 1A illustrates that a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 107-1, 107-2, . . . , 107-Q (which also may be referred to a word lines). Also, each of the sub cell arrays, e.g., sub cell array 101-2, may include a plurality of digit lines 103-1, 103-2, . . . , 103-Q (which also may be referred to as bit lines, data lines, or sense lines). In FIG. 1A, the access lines 107-1, 107-2, . . . , 107-Q are illustrated extending in a first direction (D1) 109 and the digit lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the digit lines 103-1, 103-2, . . . , 103-Q are extending in a vertical direction, e.g., third direction (D3) 111.

A memory cell, e.g., 110, may include an access device, e.g., access transistor, and a storage node located at an intersection of each access line 107-1, 107-2, . . . , 107-Q and each digit line 103-1, 103-2, . . . , 103-Q. Memory cells may be written to, or read from, using the access lines 107-1, 107-2, . . . , 107-Q and digit lines 103-1, 103-2, . . . , 103-Q. The access lines 107-1, 107-2, . . . , 107-Q may conductively interconnect memory cells along horizontal rows of each sub cell array 101-, 101-2, . . . , 101-N, and the digit lines 103-1, 103-2, . . . , 103-Q may conductively interconnect memory cells along vertical columns of each sub cell array 101-, 101-2, . . . , 101-N. One memory cell, e.g. 110, may be located between one access line, e.g., 107-2, and one digit line, e.g., 103-2. Each memory cell may be uniquely addressed through a combination of an access line 107-1, 107-2, . . . , 107-Q and a digit line 103-1, 103-2, . . . , 103-Q.

The access lines 107-1, 107-2, . . . , 107-P may be or include conducting patterns (e.g., metal lines) disposed on and spaced apart from a substrate. The access lines 107-1, 107-2, . . . , 107-Q may extend in a first direction (D1) 109. The access lines 107-1, 107-2, . . . , 107-Q in one sub cell array, e.g., 101-2, may be spaced apart from each other in a vertical direction, e.g., in a third direction (D3) 111.

The digit lines 103-1, 103-2, . . . , 103-Q may be or include conductive patterns (e.g., metal lines) extending in a vertical direction with respect to the substrate, e.g., in a third direction (D3) 111. The digit lines in one sub cell array, e.g., 101-2, may be spaced apart from each other in the first direction (D1) 109.

A gate of a memory cell, e.g., memory cell 110, may be connected to an access line, e.g., 107-2, and a first conductive node, e.g., first source/drain region, of an access device, e.g., transistor, of the memory cell 110 may be connected to a digit line, e.g., 103-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 103-2, and the other may be connected to a storage node.

Figure 1B:
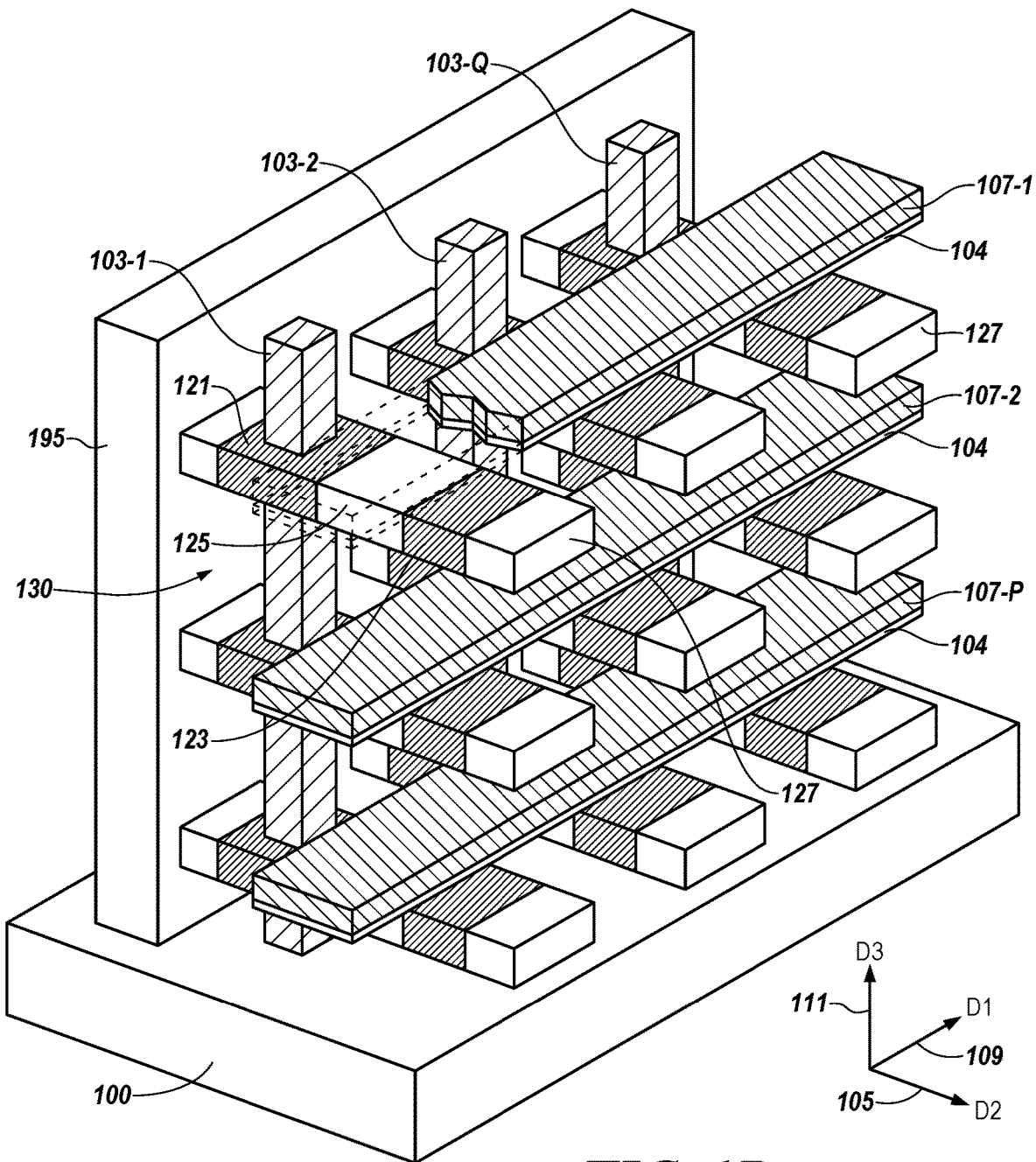
FIG. 1B is a perspective view illustrating a portion of a digit line and body contact for semiconductor devices in accordance with a number of embodiments of the present disclosure.

FIG. 1B illustrates a perspective view showing a three dimensional (3D) semiconductor memory device, e.g., a portion of a sub cell array 101-2 shown in FIG. 1A as a vertically oriented stack of memory cells in an array, according to some embodiments of the present disclosure.

As shown in FIG. 1B, a substrate 100 may have formed thereon one of the plurality of sub cell arrays, e.g., 101-2, described in connection with FIG. 1A. For example, the substrate 100 may be or include a silicon substrate, a germanium substrate, or a silicon-germanium substrate, etc. Embodiments, however, are not limited to these examples.

As shown in the example embodiment of FIG. 1B, the substrate 100 may have fabricated thereon a vertically oriented stack of memory cells, e.g., memory cell 110 in FIG. 1A, extending in a vertical direction, e.g., third direction (D3) 111. According to some embodiments the vertically oriented stack of memory cells may be fabricated such that each memory cell, e.g., memory cell 110 in FIG. 1A, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1A, and may be separated from the substrate 100 by an insulator material 120. Each of the repeating, vertical levels, L1, L2, and L3 may include a plurality of discrete components, e.g., regions, to the horizontally oriented access devices 130, e.g., transistors, and storage nodes, e.g., capacitors, including access line 107-1, 107-2, . . . , 107-Q connections and digit line 103-1, 103-2, . . . , 103-Q connections. The plurality of discrete components to the horizontally oriented access devices 130, e.g., transistors, may be formed in a plurality of iterations of vertically, repeating layers within each level, as described in more detail below in connection with FIGS. 4A-4K, and may extend horizontally in the second direction (D2) 105, analogous to second direction (D2) 105 shown in FIG. 1A.

The plurality of discrete components to the laterally oriented access devices 130, e.g., transistors, may include a first source/drain region 121 and a second source/drain region 123 separated by a channel region 125, extending laterally in the second direction (D2) 105, and formed in a body of the access devices. In some embodiments, the channel region 125 may include silicon, germanium, silicon-germanium, and/or indium gallium zinc oxide (IGZO). In some embodiments, the first and the second source/drain regions, 121 and 123, can include an n-type dopant region formed in a p-type doped body to the access device to form an n-type conductivity transistor. In some embodiments, the first and the second source/drain regions, 121 and 123, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 127, e.g., capacitor, may be connected to one respective end of the access device. As shown in FIG. 1B, the storage node 127, e.g., capacitor, may be connected to the second source/drain region 123 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1A, may similarly extend in the second direction (D2) 105, analogous to second direction (D2) 105 shown in FIG. 1A.

As shown in FIG. 1B a plurality of horizontally oriented access lines 107-1, 107-2, . . . , 107-Q extend in the first direction (D1) 109, analogous to the first direction (D1) 109 in FIG. 1A. The plurality of horizontally oriented access lines 107-1, 107-2, . . . , 107-Q may be analogous to the access lines 107-1, 107-2, . . . , 107-Q shown in FIG. 1A. The plurality of horizontally oriented access lines 107-1, 107-2, . . . , 107-Q may be arranged, e.g., "stacked", along the third direction (D3) 111. The plurality of horizontally oriented access lines 107-1, 107-2, . . . , 107-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 113-1, (L2) 113-2, and (L3) 113-P, the horizontally oriented memory cells, e.g., memory cell 110 in FIG. 1A, may be spaced apart from one another horizontally in the first direction (D1) 109. However, the plurality of discrete components to the horizontally oriented access devices 130, e.g., first source/drain region 121 and second source/drain region 123 separated by a channel region 125, extending laterally in the second direction (D2) 105, and the plurality of horizontally oriented access lines 107-1, 107-2, . . . , 107-Q extending laterally in the first direction (D1) 109, may be formed within different vertical layers within each level. For example, the plurality of horizontally oriented access lines 107-1, 107-2, . . . , 107-Q, extending in the first direction (D1) 109, may be formed on a top surface opposing and electrically coupled to the channel regions 125, separated therefrom by a gate dielectric, and orthogonal to horizontally oriented access devices 130, e.g., transistors, extending in laterally in the second direction (D2) 105. In some embodiments, the plurality of horizontally oriented access lines 107-1, 107-2, . . . , 107-Q, extending in the first direction (D1) 109 are formed in a higher vertical layer, farther from the substrate 100, within a level, e.g., within level (L1), than a layer in which the discrete components, e.g., first source/drain region 121 and second source/drain region 123 separated by a channel region 125, of the horizontally oriented access device are formed.

As shown in the example embodiment of FIG. 1B, the digit lines, 103-1, 103-2, . . . , 103-Q, extend in a vertical direction with respect to the substrate 100, e.g., in a third direction (D3) 111. Further, as shown in FIG. 1B, the digit lines, 103-1, 103-2, . . . , 103-Q, in one sub cell array, e.g., sub cell array 101-2 in FIG. 1A, may be spaced apart from each other in the first direction (D1) 109. The digit lines, 103-1, 103-2, . . . , 103-Q, may be provided, extending vertically relative to the substrate 100 in the third direction (D3) 111 in vertical alignment with source/drain regions to serve as first source/drain regions 121 or, as shown, be vertically adjacent first source/drain regions 121 for each of the horizontally oriented access devices 130, e.g., transistors, extending laterally in the second direction (D2) 105, but adjacent to each other on a level, e.g., first level (L1), in the first direction (D1) 109. Each of the digit lines, 103-1, 103-2, . . . , 103-Q, may vertically extend, in the third direction (D3), on sidewalls, adjacent first source/drain regions 121, of respective ones of the plurality of horizontally oriented access devices 130, e.g., transistors, that are vertically stacked. In some embodiments, the plurality of vertically oriented digit lines 103-1, 103-2, . . . , 103-Q, extending in the third direction (D3) 111, may be connected to side surfaces of the first source/drain regions 121 directly and/or through additional contacts including metal silicides.

For example, a first one of the vertically extending digit lines, e.g., 103-1, may be adjacent a sidewall of a first source/drain region 121 to a first one of the horizontally oriented access devices 130, e.g., transistors, in the first level (L1) 113-1, a sidewall of a first source/drain region 121 of a first one of the horizontally oriented access devices 130, e.g., transistors, in the second level (L2) 113-2, and a sidewall of a first source/drain region 121 a first one of the horizontally oriented access devices 130, e.g., transistors, in the third level (L3) 113-P, etc. Similarly, a second one of the vertically extending digit lines, e.g., 103-2, may be adjacent a sidewall to a first source/drain region 121 of a second one of the horizontally oriented access devices 130, e.g., transistors, in the first level (L1) 113-1, spaced apart from the first one of horizontally oriented access devices 130, e.g., transistors, in the first level (L1) 113-1 in the first direction (D1) 109. And the second one of the vertically extending digit lines, e.g., 103-2, may be adjacent a sidewall of a first source/drain region 121 of a second one of the laterally oriented access devices 130, e.g., transistors, in the second level (L2) 113-2, and a sidewall of a first source/drain region 121 of a second one of the horizontally oriented access devices 130, e.g., transistors, in the third level (L3) 113-P, etc. Embodiments are not limited to a particular number of levels.

The vertically extending digit lines, 103-1, 103-2, . . . , 103-Q, may include a conductive material, such as, for example, one of a doped semiconductor material, a conductive metal nitride, metal, and/or a metal-semiconductor compound. The digit lines, 103-1, 103-2, . . . , 103-Q, may correspond to digit lines (DL) described in connection with FIG. 1A.

As shown in the example embodiment of FIG. 1B, a conductive body contact may be formed extending in the first direction (D1) 109 along an end surface of the horizontally oriented access devices 130, e.g., transistors, in each level (L1) 113-1, (L2) 113-2, and (L3) 113-P above the substrate 100. The body contact may be connected to a body (as shown by 336 in FIG. 3) e.g., body region, of the horizontally oriented access devices 130, e.g., transistors, in each memory cell, e.g., memory cell 110 in FIG. 1A. The body contact may include a conductive material such as, for example, one of a doped semiconductor material, a conductive metal nitride, metal, and/or a metal-semiconductor compound.

Although not shown in FIG. 1B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 2A:
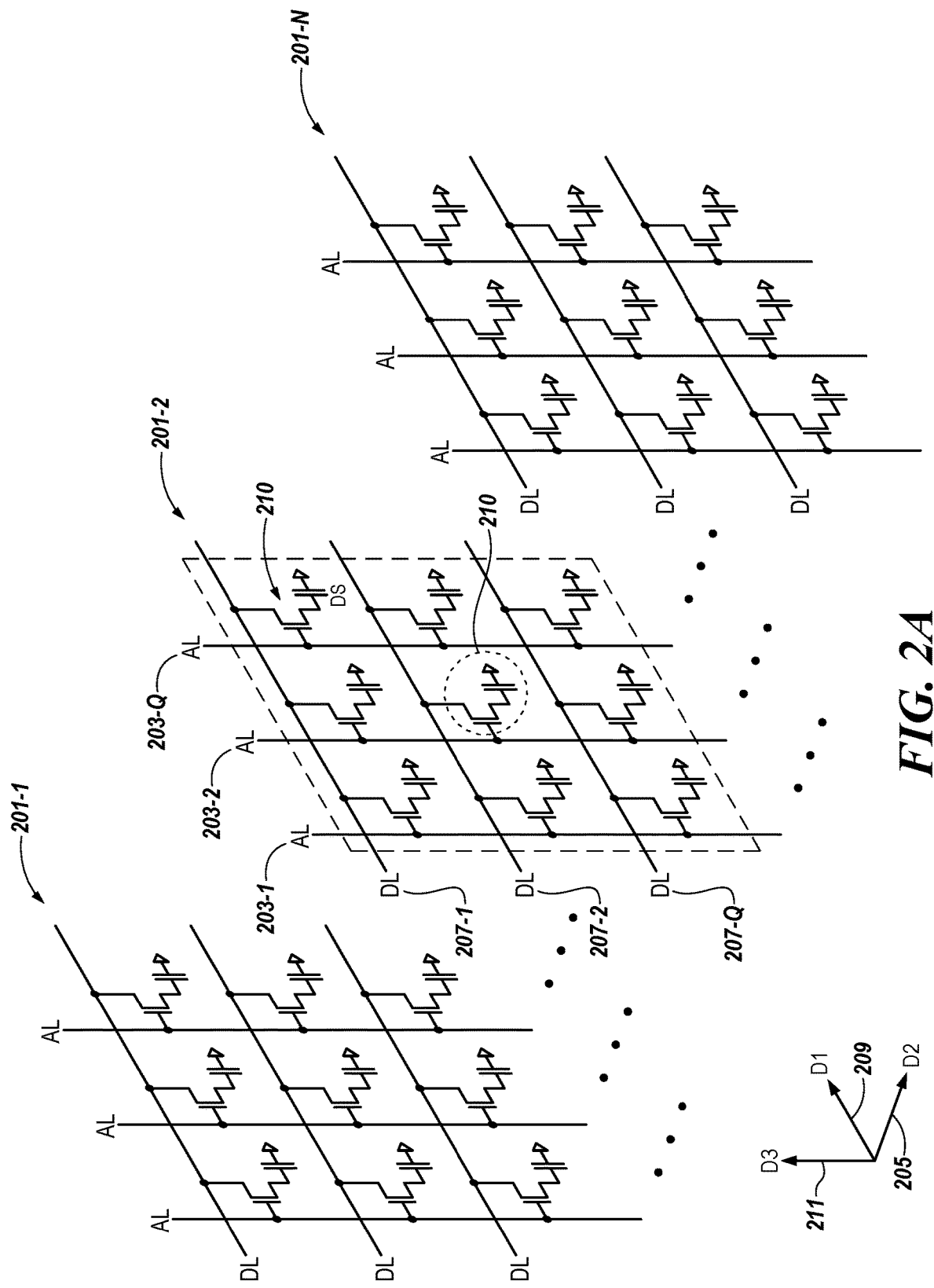
FIG. 2A is a schematic illustration of a vertical three-dimensional (3D) memory in accordance a number of embodiments of the present disclosure.

FIG. 2A is a block diagram of an apparatus in accordance with a number of embodiments of the present disclosure. FIG. 2A illustrates a circuit diagram showing a cell array of a three dimensional (3D) semiconductor memory device according to embodiments of the present disclosure. FIG. 2A illustrates that a cell array may have a plurality of sub cell arrays 201-1, 201-2, . . . , 201-N. The sub cell arrays 201-1, 201-2, . . . , 201-N may be arranged along a second direction (D2) 205. Each of the sub cell arrays (e.g., sub cell array 201-2) may include a plurality of access lines 203-1, 203-2, . . . , 203-Q (which also may be referred to as word lines). Also, each of the sub cell arrays (e.g., sub cell array 201-2) may include a plurality of digit lines 207-1, 207-2, . . . , 207-Q (which also may be referred to as bit lines, data lines, or sense lines). In FIG. 2A, the digit lines 207-1, 207-2, . . . , 207-Q are illustrated extending in a first direction (D1) 209 and the access lines 203-1, 203-2, . . . , 203-Q are illustrated extending in a third direction (D3) 211.

The first direction (D1) 209 and the second direction (D2) 205 may be considered in a horizontal ("X-Y") plane. The third direction (D3) 211 may be considered in a vertical ("Z") direction (e.g., transverse to the X-Y plane). Hence, according to embodiments described herein, the access lines 203-1, 203-2, . . . , 203-Q are extending in a vertical direction (e.g., third direction (D3) 211).

A memory cell (e.g., 210) may include an access device (e.g., access transistor) and a storage node located at an intersection of each access line 203-1, 203-2, . . . , 203-Q and each digit line 207-1, 207-2, . . . , 207-Q. Memory cells may be written to, or read from, using the access lines 203-1, 203-2, . . . , 203-Q and digit lines 207-1, 207-2, . . . , 207-Q. The digit lines 207-1, 207-2, . . . , 207-Q may conductively interconnect memory cells along horizontal columns of each sub cell array 201-, 201-2, . . . , 201-N, and the access lines 203-1, 203-2, . . . , 203-Q may conductively interconnect memory cells along vertical rows of each sub cell array 201-1, 201-2, . . . , 201-N. One memory cell, e.g., 210, may be located between one access line (e.g., 203-2) and one digit line (e.g., 207-2). Each memory cell may be uniquely addressed through a combination of an access line 203-1, 203-2, . . . , 203-Q and a digit line 207-1, 207-2, . . . , 207-Q.

The digit lines 207-1, 207-2, . . . , 207-Q may be or include conducting patterns (e.g., metal lines) disposed on and spaced apart from a substrate. The digit lines 207-1, 207-2, . . . , 207-Q may extend in a first direction (D1) 209. The digit lines 207-1, 207-2, . . . , 207-Q in one sub cell array (e.g., 201-2) may be spaced apart from each other in a vertical direction (e.g., in a third direction (D3) 211).

The access lines 203-1, 203-2, . . . , 203-Q may be or include conductive patterns (e.g., metal lines) extending in a vertical direction with respect to the substrate (e.g., in a third direction (D3) 211). The access lines in one sub cell array (e.g., 201-2) may be spaced apart from each other in the first direction (D1) 209.

A gate of a memory cell (e.g., memory cell 210) may be connected to an access line (e.g., 203-2) and a first conductive node (e.g., first source/drain region) of an access device (e.g., transistor) of the memory cell 210 may be connected to a digit line (e.g., 207-2). Each of the memory cells (e.g., memory cell 210) may be connected to a storage node (e.g., capacitor). A second conductive node (e.g., second source/drain region) of the access device (e.g., transistor) of the memory cell 210 may be connected to the storage node (e.g., capacitor). Storage nodes, such as capacitors, can be formed from ferroelectric and/or dielectric materials such as zirconium oxide ($ZrO_2$), hafnium oxide ($HfO_2$) oxide, lanthanum oxide ($La_2O_3$), lead zirconate titanate (PZT, Pb[Zr(x)Ti(1-x)]$O_3$), barium titanate ($BaTiO_3$), aluminum oxide (e.g., $Al_2O_3$), a combination of these with or without dopants, or other suitable materials.

While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line (e.g., 207-2) and the other may be connected to a storage node.

Figure 2B:
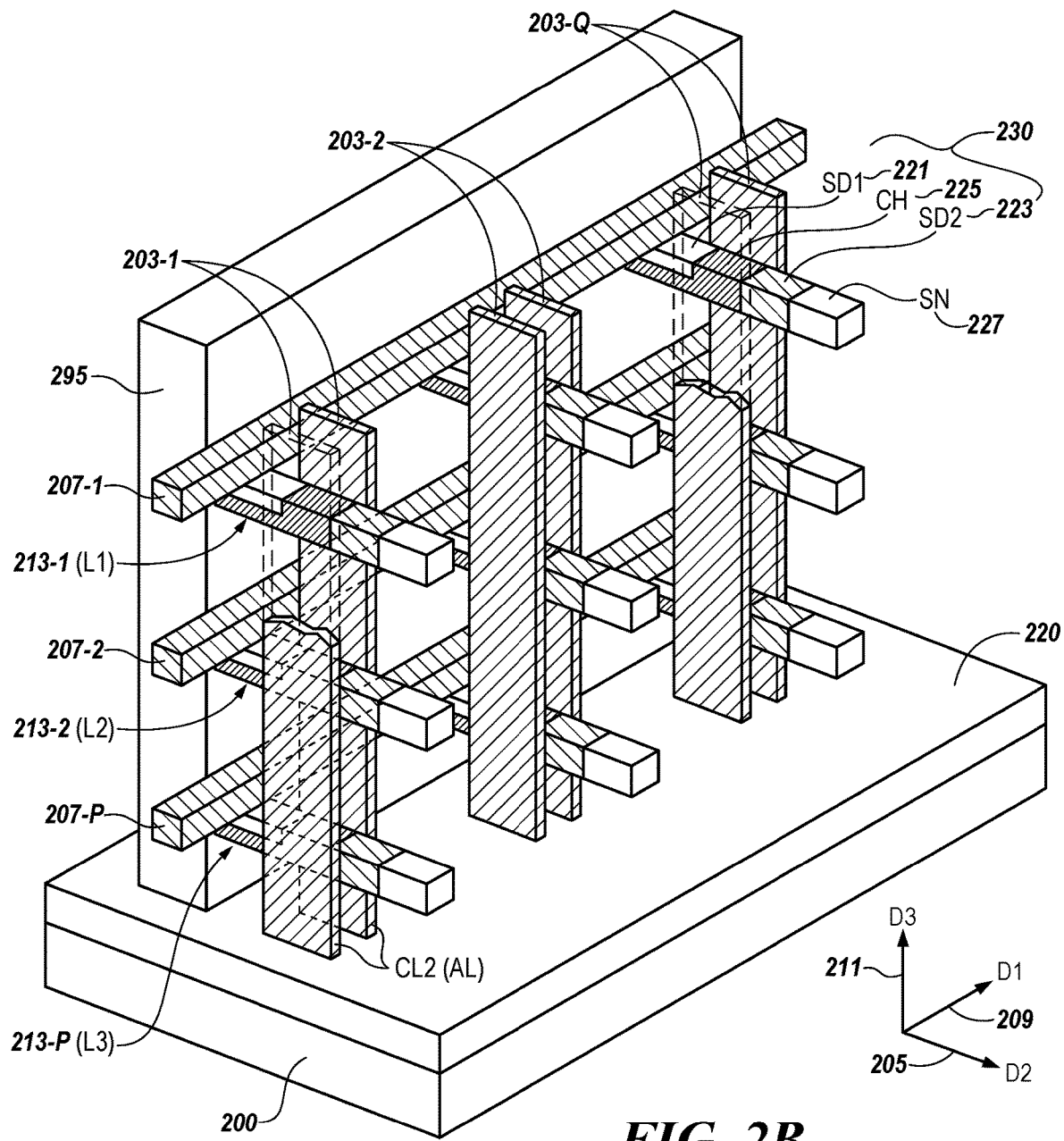
FIG. 2B is a perspective view illustrating a portion of a three-node access device in a vertical three-dimensional (3D) memory array in accordance with a number of embodiments of the present disclosure.
Figure 3:
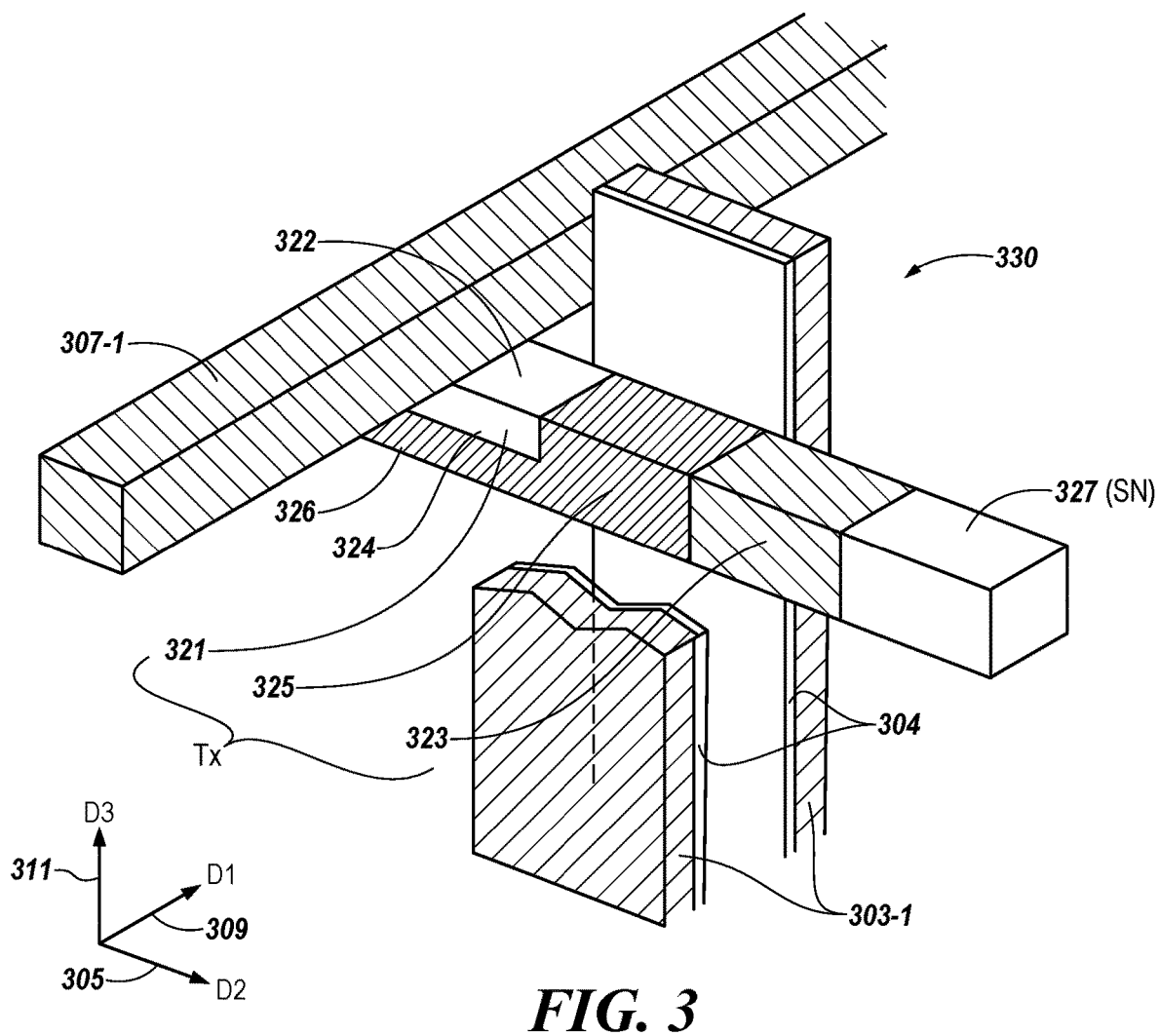
FIG. 3 is a perspective view illustrating a portion of a three-node access device in a vertical three-dimensional (3D) memory cell in accordance with a number of embodiments of the present disclosure.

FIG. 2B illustrates a perspective view showing a three dimensional (3D) semiconductor memory device (e.g., a portion of a sub cell array 201-2 shown in FIG. 2A as a vertically oriented stack of memory cells in an array) according to some embodiments of the present disclosure. FIG. 3 illustrates a perspective view showing unit cell (e.g., memory cell 210 shown in FIG. 2A) of the 3D semiconductor memory device shown in FIG. 2B.

As shown in FIG. 2B, a substrate 200 may have formed thereon one of the plurality of sub cell arrays (e.g., 201-2) described in connection with FIG. 2A. For example, the substrate 200 may be or include a silicon substrate, a germanium substrate, or a silicon-germanium substrate, etc. Embodiments, however, are not limited to these examples.

As shown in the example embodiment of FIG. 2B, the substrate 200 may have fabricated thereon a vertically oriented stack of memory cells (e.g., memory cell 210 in FIG. 2A) extending in a vertical direction (e.g., third direction (D3) 211). According to some embodiments the vertically oriented stack of memory cells may be fabricated such that each memory cell (e.g., memory cell 210 in FIG. 2A) is formed on plurality of vertical levels (e.g., a first level (L1), a second level (L2), and a third level (L3)). The repeating, vertical levels, L1, L2, and L3, may be arranged (e.g., "stacked") a vertical direction (e.g., third direction (D3) 211 shown in FIG. 2A) and may be separated from the substrate 200 by an insulator material 220. Each of the repeating, vertical levels, L1, L2, and L3 may include a plurality of discrete components (e.g., regions) to the laterally oriented access devices 230 (e.g., transistors) and storage nodes (e.g., capacitors) including access line 203-1, 203-2, . . . , 203-Q connections and digit line 207-1, 207-2, . . . , 207-Q connections. The plurality of discrete components to the laterally oriented access devices 230 (e.g., transistors) may be formed in a plurality of iterations of vertically, repeating layers within each level, as described in more detail below in connection with FIGS. 4A-4K, and may extend horizontally in the second direction (D2) 205, analogous to second direction (D2) 205 shown in FIG. 2A.

The plurality of discrete components to the laterally oriented access devices 230 (e.g., transistors) may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 227 (e.g., capacitor) may be connected to one respective end of the access device. As shown in FIG. 2B, the storage node 227 (e.g., capacitor) may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell (e.g., memory cell 210 in FIG. 2A) may similarly extend in the second direction (D2) 205, analogous to second direction (D2) 205 shown in FIG. 2A.

As shown in FIG. 2B a plurality of horizontally oriented digit lines 207-1, 207-2, . . . , 207-Q extend in the first direction (D1) 209, analogous to the first direction (D1) 209 in FIG. 2A. The plurality of horizontally oriented digit lines 207-1, 207-2, . . . , 207-Q may be analogous to the digit lines 207-1, 207-2, . . . , 207-Q shown in FIG. 2A. The plurality of horizontally oriented digit lines 207-1, 207-2, . . . , 207-Q may be arranged (e.g., "stacked") along the third direction (D3) 211. The plurality of horizontally oriented digit lines 207-1, 207-2, . . . , 207-Q may include a conductive material. For example, the conductive material may include one or more of a doped semiconductor (e.g., doped silicon, doped germanium, etc.) a conductive metal nitride (e.g., titanium nitride, tantalum nitride, etc.) a metal (e.g., tungsten (W), titanium (Ti), tantalum (Ta), ruthenium (Ru), cobalt (Co), molybdenum (Mo), etc.) and/or a metal-semiconductor compound (e.g., tungsten silicide, cobalt silicide, titanium silicide, etc.) Embodiments, however, are not limited to these examples.

Among each of the vertical levels, (L1) 213-1, (L2) 213-2, and (L3) 213-P, the horizontally oriented memory cells (e.g., memory cell 210 in FIG. 2A) may be spaced apart from one another horizontally in the first direction (D1) 209. However, as described in more detail below in connection with FIGS. 4A, et seq., the plurality of discrete components to the laterally oriented access devices 230 (e.g., first source/drain region 221 and second source/drain region 223 separated by a channel region 225), extending laterally in the second direction (D2) 205, and the plurality of horizontally oriented digit lines 207-1, 207-2, . . . , 207-Q, extending laterally in the first direction (D1) 209, may be formed within different vertical layers within each level. For example, the plurality of horizontally oriented digit lines 207-1, 207-2, . . . , 207-Q, extending in the first direction (D1) 209, may be disposed on, and in electrical contact with, top surfaces of first source/drain regions 221 and orthogonal to laterally oriented access devices 230 (e.g., transistors) extending laterally in the second direction (D2) 205. In some embodiments, the plurality of horizontally oriented digit lines 207-1, 207-2, . . . , 207-Q, extending in the first direction (D1) 209 are formed in a higher vertical layer, farther from the substrate 200, within a level (e.g., within level (L1)) than a layer in which the discrete components (e.g., first source/ drain region 221 and second source/drain region 223 separated by a channel region 225) of the laterally oriented access device are formed. In some embodiments, the plurality of horizontally oriented digit lines 207-1, 207-2, . . . , 207-Q, extending in the first direction (D1) 209, may be connected to the top surfaces of the first source/drain regions 221 directly and/or through additional contacts including metal silicides.

As shown in the example embodiment of FIG. 2B, the access lines, 203-1, 203-2, . . . , 203-Q, extend in a vertical direction with respect to the substrate 200 (e.g., in a third direction (D3) 211). Further, as shown in FIG. 2B, the access lines, 203-1, 203-2, . . . , 203-Q, in one sub cell array (e.g., sub cell array 201-2 in FIG. 2A) may be spaced apart from each other in the first direction (D1) 209. The access lines, 203-1, 203-2, . . . , 203-Q, may be provided, extending vertically relative to the substrate 200 in the third direction (D3) 211 between a pair of the laterally oriented access devices 230 (e.g., transistors) extending laterally in the second direction (D2) 205, but adjacent to each other on a level (e.g., first level (L1)) in the first direction (D1) 209. Each of the access lines, 203-1, 203-2, . . . , 203-Q, may vertically extend, in the third direction (D3), on sidewalls of respective ones of the plurality of laterally oriented access devices 230 (e.g., transistors) that are vertically stacked.

For example, and as shown in more detail in FIG. 3, a first one of the vertically extending access lines (e.g., 203-1) may be adjacent a sidewall of a channel region 225 to a first one of the laterally oriented access devices 230 (e.g., transistors) in the first level (L1) 213-1, a sidewall of a channel region 225 of a first one of the laterally oriented access devices 230 (e.g., transistors) in the second level (L2) 213-2, and a sidewall of a channel region 225 a first one of the laterally oriented access devices 230 (e.g., transistors) in the third level (L3) 213-P, etc. Similarly, a second one of the vertically extending access lines (e.g., 203-2) may be adjacent a sidewall to a channel region 225 of a second one of the laterally oriented access devices 230 (e.g., transistors) in the first level (L1) 213-1, spaced apart from the first one of laterally oriented access devices 230 (e.g., transistors) in the first level (L1) 213-1 in the first direction (D1) 209. And the second one of the vertically extending access lines (e.g., 203-2) may be adjacent a sidewall of a channel region 225 of a second one of the laterally oriented access devices 230 (e.g., transistors) in the second level (L2) 213-2, and a sidewall of a channel region 225 of a second one of the laterally oriented access devices 230 (e.g., transistors) in the third level (L3) 213-P, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 2A.

As shown in the example embodiment of FIG. 2B, a conductive body contact 295 may be formed extending in the first direction (D1) 209 along an end surface of the laterally oriented access devices 230 (e.g., transistors) in each level (L1) 213-1, (L2) 213-2, and (L3) 213-P above the substrate 200. The body contact 295 may be connected to a body, as shown by 336 in FIG. 3, (e.g., body region) of the laterally oriented access devices 230 (e.g., transistors) in each memory cell (e.g., memory cell 210 in FIG. 2A). The body contact 295 may include a conductive material such as, for example, one of a doped semiconductor material, a conductive metal nitride, metal, and/or a metal-semiconductor compound.

Although not shown in FIG. 2B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell (e.g., memory cell 210 in FIG. 2A) of the vertically stacked array of memory cells (e.g., within a sub cell array 201-2 in FIG. 2A) according to some embodiments of the present disclosure. As shown in FIG. 3, the first and the second source/drain regions, 321 and 323, may be impurity doped regions to the laterally oriented access devices 330 (e.g., transistors). The first and the second source/drain regions, 321 and 323, may be analogous to the first and the second source/drain regions 221 and 223 shown in FIG. 2B. The first and the second source/drain regions may be separated by a channel 325 formed in a body of semiconductor material (e.g., body region 326) of the laterally oriented access devices 330 (e.g., transistors). The first and the second source/drain regions, 321 and 323, may be formed from an n-type or p-type dopant doped in the body region 326. Embodiments are not so limited.

For example, for an n-type conductivity transistor construction, the body region 326 of the laterally oriented access devices 330 (e.g., transistors) may be formed of a low doped (p−) p-type semiconductor material. In some embodiments, the body region 326 and the channel 325 separating the first and the second source/drain regions, 321 and 323, may include a low doped, p-type (e.g., low dopant concentration (p−)) polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples.

As used herein, a degenerate semiconductor material is intended to mean a semiconductor material, such as polysilicon, containing a high level of doping with significant interaction between dopants (e.g., phosphorous (P), boron (B), etc.). Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the laterally oriented access devices 330 (e.g., transistors) may be of a p-type conductivity construction in which case the impurity (e.g., dopant) conductivity types would be reversed.

As shown in the example embodiment of FIG. 3, the first source/drain region 321 may occupy an upper portion in the body 326 of the laterally oriented access devices 330 (e.g., transistors). For example, the first source/drain region 321 may have a bottom surface 324 within the body 326 of the laterally oriented access device 330 which is located higher, vertically in the third direction (D3) 311, than a bottom surface of the body 326 of the laterally, horizontally oriented access device 330. As such, the laterally, horizontally oriented transistor 330 may have a body portion 326 which is below the first source/drain region 321 and is in electrical contact with the body contact (e.g., 295 shown in FIG. 2B). Further, as shown in the example embodiment of FIG. 3, a digit line (e.g., 307-1) analogous to the digit lines 207-1, 207-2, . . . , 207-Q in FIG. 2B and 207-1, 207-2, . . . , 207-Q shown in FIG. 2A, may disposed on a top surface 322 of the first source/drain region 321 and electrically coupled thereto.

As shown in the example embodiment of FIG. 3, an access line (e.g., 303-1 analogous to the access lines 203-1, 203-2, . . . , 203-Q in FIG. 2B and 203-1, 203-2, . . . , 203-Q in FIG. 2A) may be vertically extending in the third direction (D3) 311 adjacent sidewall of the channel region 325 portion of the body 326 to the laterally oriented access devices 330 (e.g., transistors) horizontally conducting between the first and the second source/drain regions 321 and 323 along the second direction (D2) 305. A gate dielectric material 304 may be interposed between the access line 303-1 (a portion thereof forming a gate to the laterally oriented access devices 330 (e.g., transistors) and the channel region 325.

The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4:
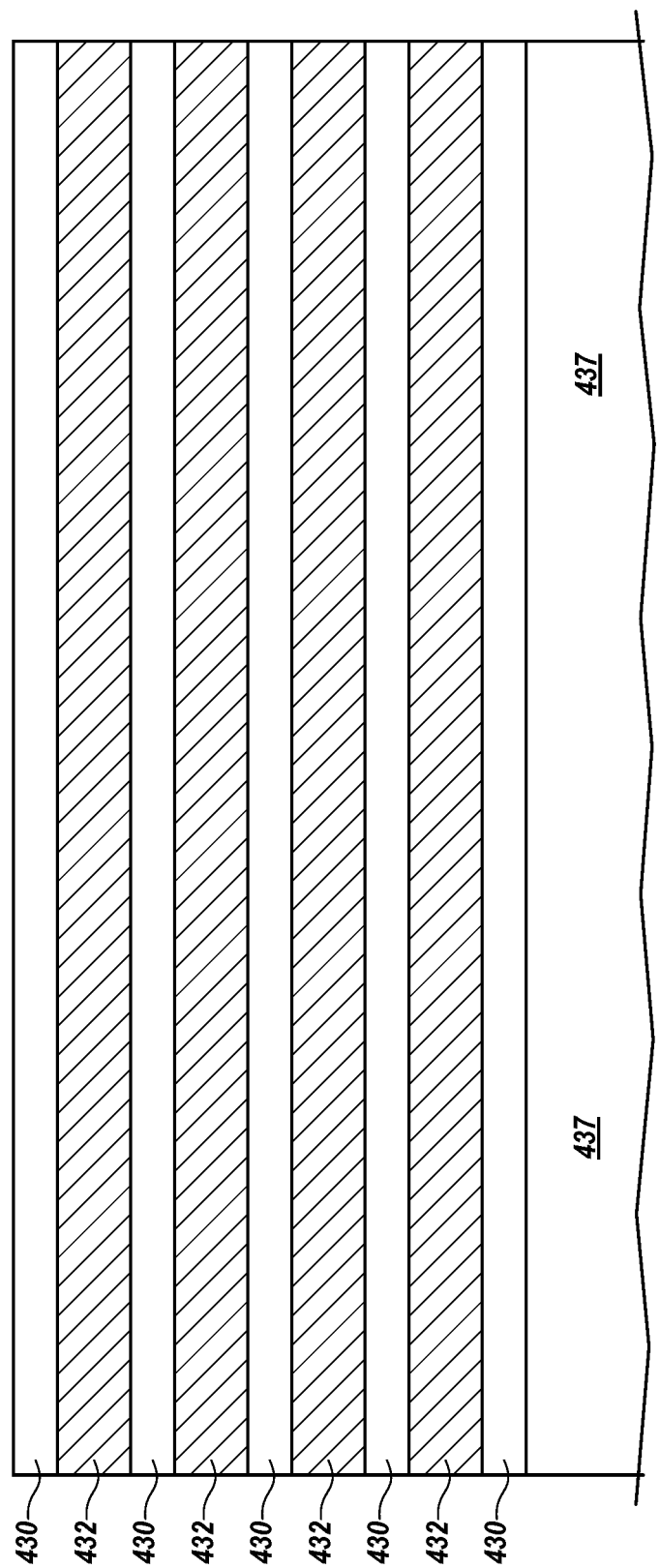
FIG. 4 illustrates an example process for creating a single crystalline silicon stack for vertical three dimensional (3D) memory, in accordance with a number of embodiments of the present disclosure.

FIG. 4 illustrates an example process for creating a single crystalline silicon stack for vertical three dimensional (3D) memory, such as illustrated in FIGS. 1-3, and in accordance with a number of embodiments of the present disclosure. The vertical stack includes multiple layers of single crystal silicon germanium 430 and single crystal silicon 432 formed on a substrate 437.

As discussed above, this may be accomplished, for example, by providing a thin single crystal silicon germanium layer, as a seed layer, and then heating the layer to grow the single crystal silicon germanium layer thickness through epitaxial growth. Once the desired layer thickness is formed, a silicon layer can be formed into the surface of silicon germanium layer. As with the silicon germanium layer, this may be accomplished, for example, by providing a thin single crystal silicon layer, as a seed layer, and then heating the layer to grow the single crystal silicon layer thickness through epitaxial growth.

For example, the single crystal silicon germanium 430 may be epitaxially grown by flowing silicon base gases over the thin seed layer of single crystal silicon germanium formed, for the first layer, on the surface of the substrate 437 and for subsequent single crystal silicon germanium layers, over a thin seed layer of single crystal silicon germanium formed on the surface of the exposed single crystal silicon layer of the vertical stack. For instance, a disilane ($Si_2H_6$) gas may be utilized to cause single crystal silicon germanium to be epitaxially grown from the exposed surface of the thin layer of single crystal silicon germanium that has been deposited as a seed for the epitaxial growth of the single crystal silicon germanium. However, embodiments are not so limited. For instance, dichlorosilane ($SiH_2Cl_2$) gas may flow over the seed layer to cause single crystal silicon germanium 430 to epitaxially grow onto the exposed surface of the seed layer.

In order to form a single crystal silicon layer on the previously formed single crystal silicon germanium layer, depending on the silicon germanium concentration, if silicon is x quantity and germanium is y quantity and, if y is smaller than x, then silicon/silicon germanium has a small lattice mismatch with respect to the lattice of single crystal silicon, as discussed above. This allows single crystal silicon to be grown on top of single crystal silicon germanium with a single crystal structure. If a thin layer of single crystal silicon is applied to the surface of the single crystal silicon germanium, then the whole single crystal silicon layer acts as a seed for the growth of the single crystal silicon layer.

The process and parameters for the formation of a single crystal silicon layer are similar to those described above with respect to single crystal silicon germanium layers. For example, the single crystal silicon 432 may be epitaxially grown by flowing silicon base gases over the thin seed layer of single crystal silicon formed over a thin seed layer of single crystal silicon formed on the surface of the exposed single crystal silicon germanium layer of the vertical stack that has been formed previously. For instance, a disilane ($Si_2H_6$) gas may be utilized to cause single crystal silicon to be epitaxially grown from the exposed surface of the thin layer of single crystal silicon that has been deposited as a seed for the epitaxial growth of the single crystal silicon layer.

However, embodiments are not so limited. For instance, dichlorosilane ($SiH_2Cl_2$) gas may flow over the seed layer to cause single crystal silicon 432 to epitaxially grow onto the exposed surface of the single crystal silicon seed layer.

In some embodiments, similar to the formation of the single crystal silicon germanium layers, the flowing of the silicon based gas over the single crystal silicon seed layer at a temperature selected, for example, from between 300° C. to 1100° C. may cause the single crystal silicon 432 to epitaxially grow at a predictable rate. Based on this predictable growth rate, the single crystal silicon layer can be grown to a desired height over a predetermined time period.

Such layering can be done in alternating iterations (e.g., SiGe/Si/SiGe/Si, etc.) to create a superlattice structure in the form of a vertical stack. This unpatterned (no patterning within the layers) vertical stack can, then, be attached to a CMOS wafer, as described with respect to FIG. 5. One benefit of this process is that because the vertical stack has not been patterned yet, it does not need to be carefully aligned with the CMOS wafer. In vertically stacked memory array structures, it may be advantageous to arrange conductive lines (e.g., digit lines or access lines) in a twisted manner (e.g., as shown in more detail in FIG. 5A) to ease spatial restraints. Embodiments of the present disclosure allow for the formation of such conductive lines that eases spatial restraints even further.

Figure 5A:
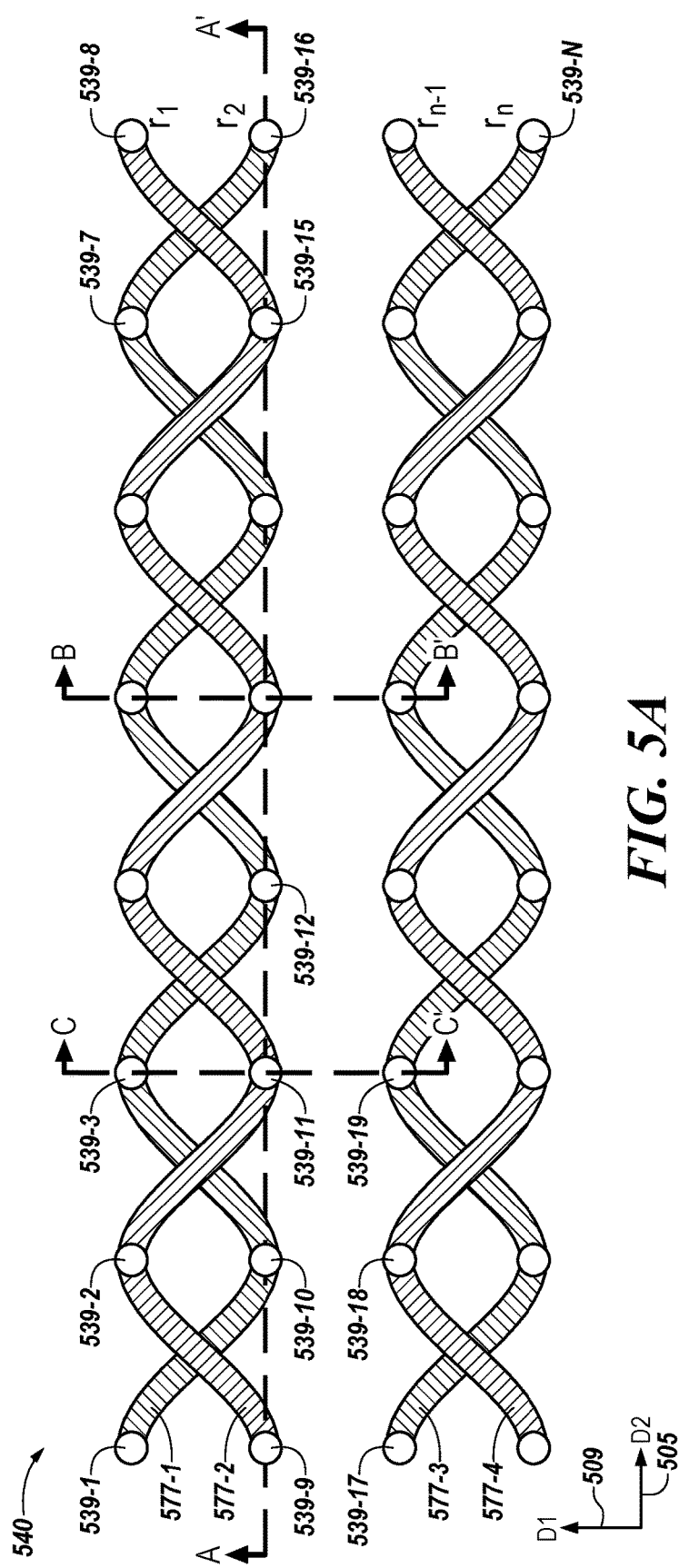
FIGS. 5A-B illustrate a portion of a semiconductor memory device with multiple contacts of twisted conductive lines in accordance with one or more embodiments of the present disclosure.
Figure 5B:
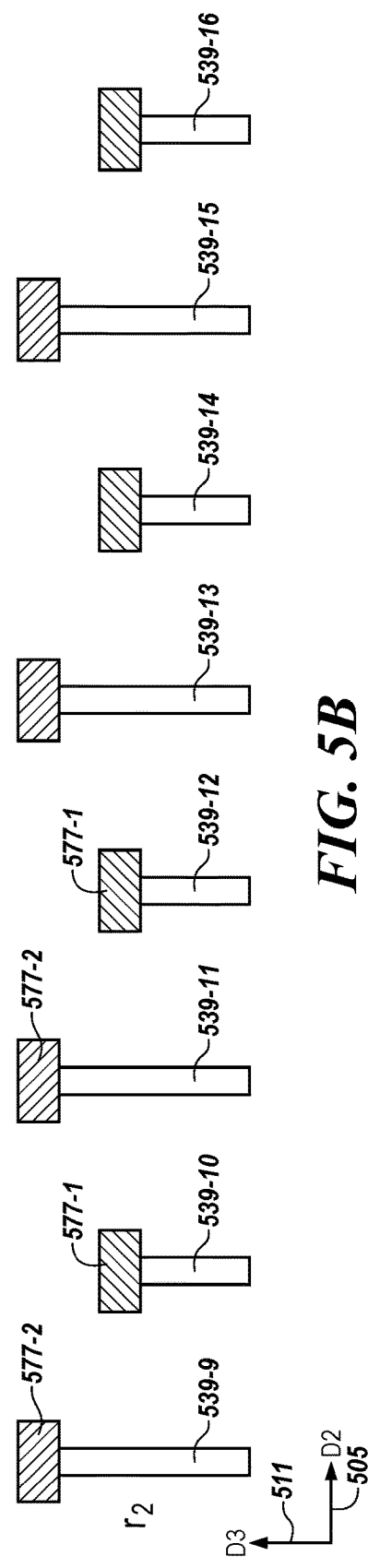

FIGS. 5A-B illustrate a portion of a semiconductor memory device with multiple contacts of twisted conductive lines in accordance with one or more embodiments of the present disclosure. FIG. 5A is an overhead view of a portion 540 of a memory cell array of a semiconductor device with twisted conductive lines in accordance with a number of embodiments of the present disclosure. In some applications, it may be desirable to arrange conductive lines 577 (e.g., routing lines) of a semiconductor device in the curved or twisted manner as shown in FIG. 5A. This structure can, for example, reduce parasitic capacitance between adjacent conductive lines 577 and the resulting noise that the remainder of the semiconductor device (e.g., circuitry 711 of FIG. 7) may experience. To achieve this structure, one of the conductive lines 577 (e.g., 577-2) must lie vertically (i.e., direction D3, or 511 of FIG. 5B) above another conductive line 577 (e.g., 577-1).

In some applications, it may be advantageous to reduce the distance between conductive lines 577 in horizontal direction 509 (i.e., distance between 577-1 and 577-3) to reduce overall space. To achieve this, the distance between conductive line contacts 539 in a horizontal direction 509 will need to be reduced (i.e., distance in horizontal direction 509 between 539-3 and 539-19). Embodiments of the present disclosure describe systems, methods, and apparatuses for easing spatial constraints of a portion 540 of a semiconductor memory device when forming twisted conductive lines 577.

Horizontally oriented conductive lines 577-1 and 577-2 (referred to collectively as 577) may be any conductive lines of a vertically stacked memory array structure. For example, conductive lines 577 may be digit lines (e.g., digit lines 107-1, . . . , 107-Q in FIG. 1) or access lines (e.g., access lines 103-1, . . . , 103-Q of FIG. 1). Embodiments of the present disclosure, however, are not limited to such. As shown in FIG. 5A, conductive lines 577 may have one or more curved portions. For example, conductive lines 577 may be shaped sinusoidally. The shape of a lower conductive line 577-1 may be the inverse of the shape of an upper conductive line 577-2. For example, if bottom lower conductive line 577-1 is shaped as a sine wave, the top conductive line 577-2 may be shaped as the inverse of the sine wave.

Each horizontal conductive line 577 may be formed onto a number of vertical conductive line contacts 539-1, . . . , 539-N (referred to collectively herein as 539).

The conductive contacts 539 may be formed in an array structure. In other words, the conductive contacts 539 may be formed in one or more horizontal rows $r_1, \ldots, r_n$ (referred to herein collectively as r) extending in a horizontal direction 505. Each horizontal row $r_n$ may be spaced a given distance away from the row preceding it $r_{n-1}$ in another horizontal direction 509. A conductive line 577 may make contact, in an alternating manner, with each odd-numbered conductive contact in an odd-numbered row and each even-numbered contact in the even-numbered row adjacent to the odd-numbered row. For example, conductive line 577-1 may make contact with conductive contacts 539-1, 539-3, . . . , 539-7 of row $r_1$ and conductive contacts 539-10, 539-12, . . . , 539-16 of row $r_2$. An upper conductive line 577-2 (i.e., a conductive line vertically above 577-1) may make contact with each even-numbered conductive contact in an odd-numbered row (e.g., 539-2, . . . , 539-8 of $r_1$) and each odd-numbered contact in an adjacent even-numbered row (e.g., 539-9, 539-11, . . . , 539-15 of $r_2$). To facilitate this structure, odd-numbered conductive line contacts in odd-numbered rows $r_1, \ldots, r_{n-1}$ and even-numbered contacts in even numbered rows $r_2$, will be shorter than the rest of the contacts 539, as illustrated in FIG. 5B.

The arrangement shown in FIG. 5A may be achieved by first forming the conductive line contacts 539 and subsequently forming the conductive lines 577 onto the appropriate contacts 539. For example, conductive line 577-1 may be formed by first forming rows $r_1$ and $r_2$ of contacts 539-1, . . . , 539-16 and then continuously forming a conductive material onto contacts 539-1, 539-10, 539-3, 539-12, . . . , 539-7, . . . , 539-16 to create a curved conductive line 577-1. As stated herein, the conductive lines 577 may be formed using any conductive material. For example, the conductive material may include one or more of a doped semiconductor (e.g., doped silicone, doped germanium, etc.), a conductive metal nitride (e.g., titanium nitride, tantalum nitride, etc.), a metal (e.g., tungsten (W), titanium (Ti), tantalum (Ta), ruthenium (Ru), cobalt (Co), molybdenum (Mo), etc.) and/or a metal-semiconductor compound (e.g., tungsten silicide, cobalt silicide, titanium silicide, etc.). Embodiments, however, are not limited to these examples. In some embodiments, conductive lines 577 may all be formed from similar types of conductive material. Conductive contacts 639 may also be formed from a conductive material.

FIG. 5B illustrates a cross-section of the semiconductor memory device of FIG. 5A along line 'A'. As shown in FIG. 5B, conductive contacts 539 may be arranged such that each contact 539 extends in a vertical direction 511 and is of one of two given vertical lengths. The lengths of the conductive contacts 539 along a given row (e.g., $r_2$) may alternate such that 539-9, 539-11, 539-13, . . . , 539-15 on which 577-2 is formed are of a greater vertical length than contacts 539-10, 539-12, 539-14, . . . , 539-16 on which conductive line 577-1 is formed. Thus, an upper conductive line 577-2 may run above a lower conductive line 577-1. This allows for the conductive lines 577 to be arranged in the manner shown in FIG. 5A without causing connectivity issues.

The conductive line contacts 539 arranged in rows may connect the conductive lines 577 to other components within a semiconductor memory structure. For example, conductive line contacts 539 may connect conductive lines 577 to a complementary metal oxide semiconductor (CMOS) structure.

In some embodiments, each conductive line contact 539 may make contact with the plurality of digit lines 103-1, 103-2, . . . , 103-Q shown in FIG. 1B. In such an arrangement, each conductive line contact 539 may extend in direction D3 and make contact with a top surface of a digit line of the plurality of digit lines 103-1, 103-2, . . . , 103-Q. For example, conductive line contact 539-1 may make contact with a top surface of digit line 103-1. As a result, horizontally-extending conductive line 577-1 may be connected to vertical digit line 103-1 through the conductive line contact 539-1. Alternatively, each conductive line contact 539 may make contact with the vertically extending access lines 203-1, 203-2, . . . , 203-Q of FIG. 2B. For example, conductive line contact 539-1 may make contact with top surfaces of the pair of access lines 203-1. As such, horizontally-extending conductive line 577-1 may be connected to the vertical access lines 203-1 through the conductive line contact 539-1.

Figure 7:
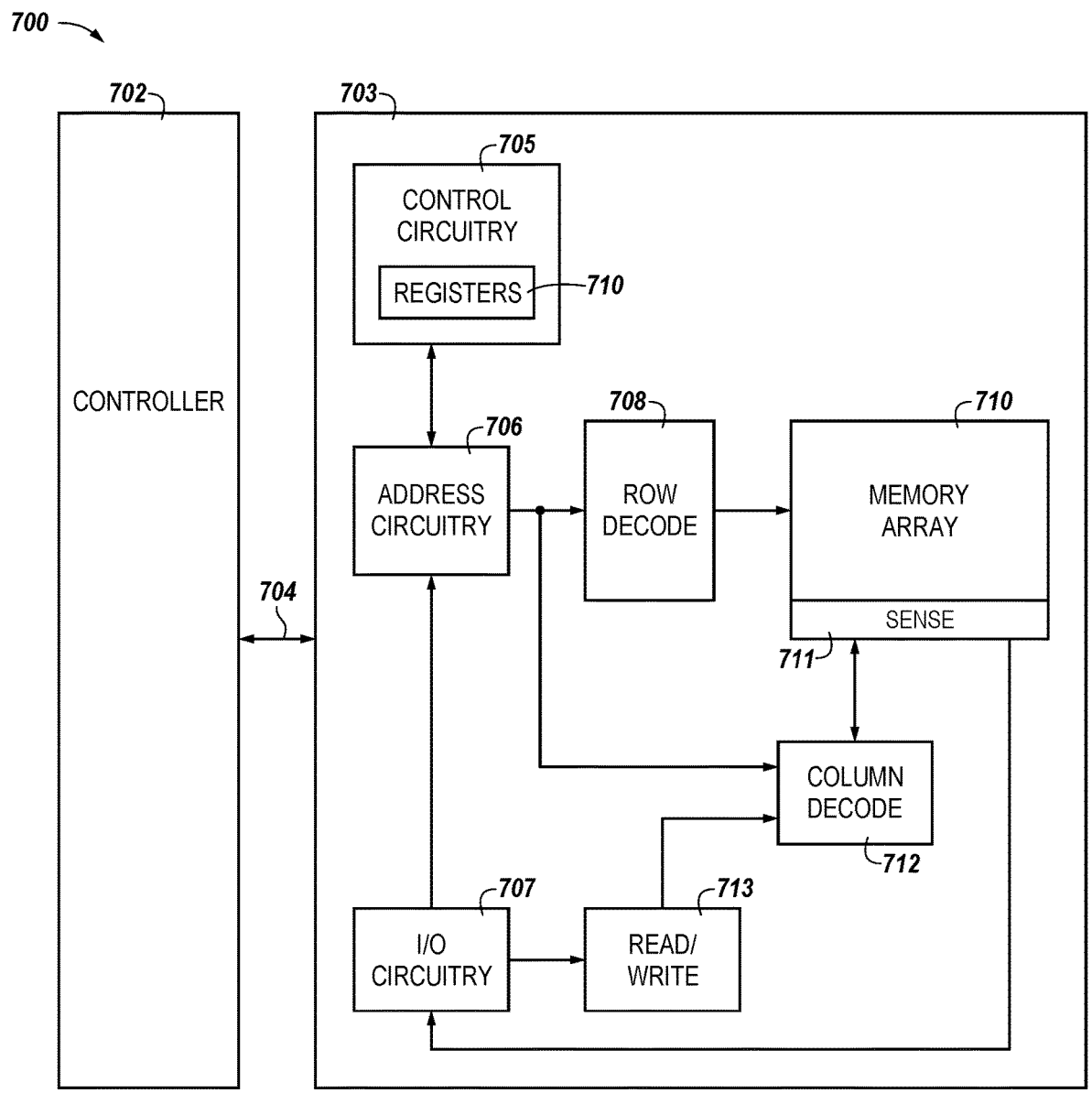
FIG. 7 is a block diagram of an apparatus in the form of a computing system including a memory device in accordance with a number of embodiments of the present disclosure.

Contacts 539 may also connect conductive lines 577 to any of the following, although embodiments of the present disclosure are not so limited: a source/drain region of an access device (e.g., source/drain regions 221 and 223 of FIG. 2B), a conductive body contact of a semiconductor memory device (e.g., conductive body contact 295 of FIG. 2B), a substrate of a semiconductor memory device (e.g., substrate 200 of FIG. 2B), a gate dielectric (e.g., gate dielectric 304 of FIG. 3), a channel region of an access device (e.g., channel region 225 of FIG. 2B), or any portion of a circuitry of a semiconductor memory device (e.g., circuitry 711 of FIG. 7). In some embodiments, conductive lines 577 may be in direct contact with another component of the semiconductor device, such as any of the previously listed components.

Conductive lines 577 may be any conductive line or routing line of a semiconductor device. For example, conductive lines 577 may be digit lines (e.g., similar to digit lines 207 of FIG. 2B), access lines, or word lines (e.g., similar to access lines/word lines 203 of FIG. 2B).

Figure 6A:
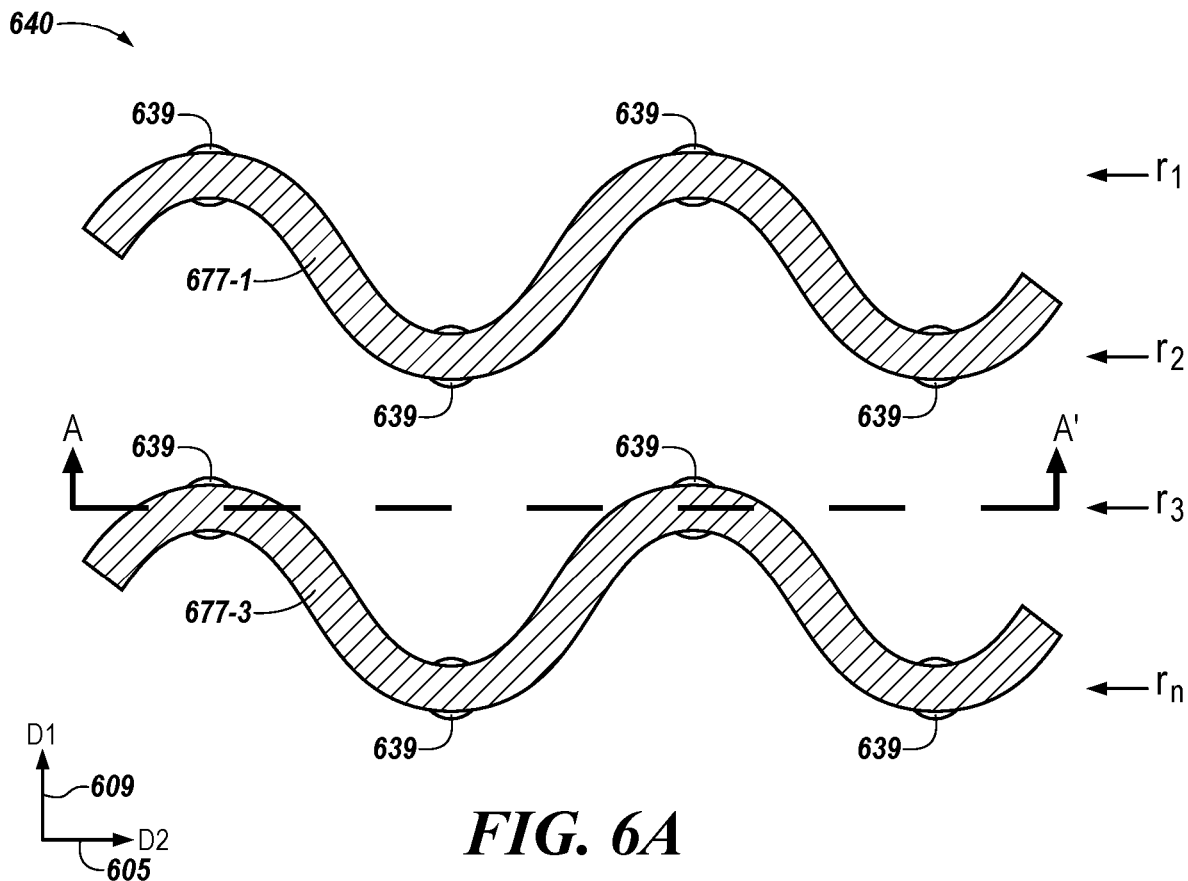
FIGS. 6A-I illustrate a process of forming twisted conductive lines for a semiconductor memory device in accordance with one or more embodiments of the present disclosure.

FIG. 6A illustrates a step in a process for forming twisted conductive lines of a semiconductor memory device in accordance with a number of embodiments of the present disclosure. As shown in FIG. 6A, one or more lower conductive lines 677 (e.g., 677-1 and 677-3) may be formed by forming a first number of vertically oriented conductive contacts 639. Each conductive contact may extend in a vertical direction (i.e., direction 611 of FIG. 6B) and be of an equal vertical length. The conductive contacts 639 may be formed in a number of rows $r_1, \ldots, r_n$ extending in a horizontal direction 605. The conductive contacts 639 of odd-numbered rows (e.g., $r_1$) may align with the conductive contacts 639 of other odd-numbered rows (e.g., $r_3$). Likewise, even-numbered rows (e.g., $r_2$) may be aligned with other even-numbered rows (e.g., $r_n$). Each even-numbered row may be offset from an odd-numbered row adjacent to it in a horizontal direction 605. In other words, each row $r_n$ may be spaced apart from the row preceding it $r_{n-1}$ in both a first horizontal direction 605 and a perpendicular horizontal direction 609.

Each lower conductive line 677 may be formed onto each of the conductive contacts 639 of two rows $r_1$ and $r_2$. When a second row $r_2$ of conductive contacts is offset in a horizontal direction 605 from $r_1$, this will cause the conductive line 677 to have one or more curved portions. Such a conductive line may be referred to herein as a "twisted conductive line."

Figure 6B:
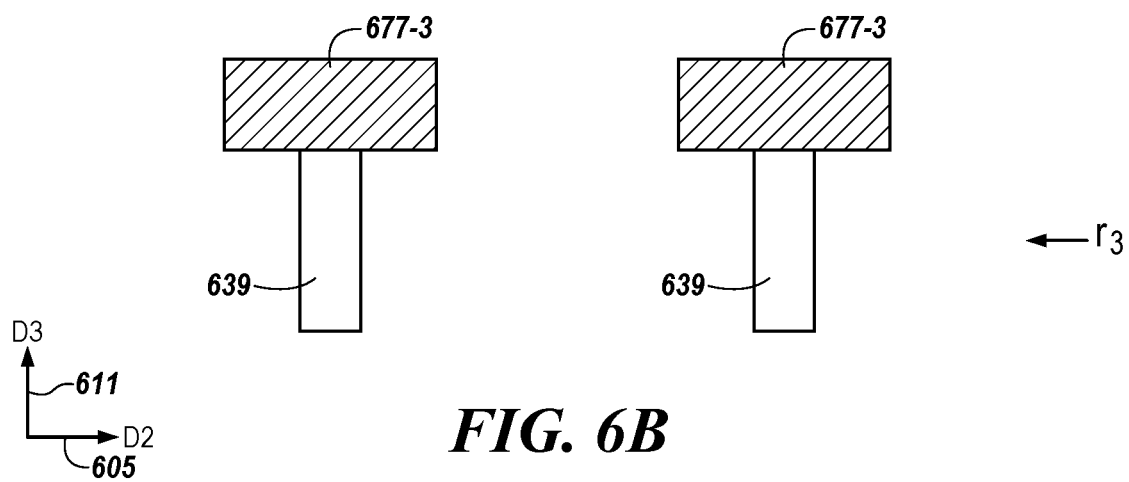

FIG. 6B is a cross-sectional view along line 'A' of FIG. 6A. As shown in FIG. 6B, one or more conductive contacts 639 extending in a vertical direction 611 may be formed along a horizontal direction 605, with the vertical lengths of each conductive contact 639 being equal. A lower conductive line 677-3 may be formed onto contacts 639.

Figure 6C:
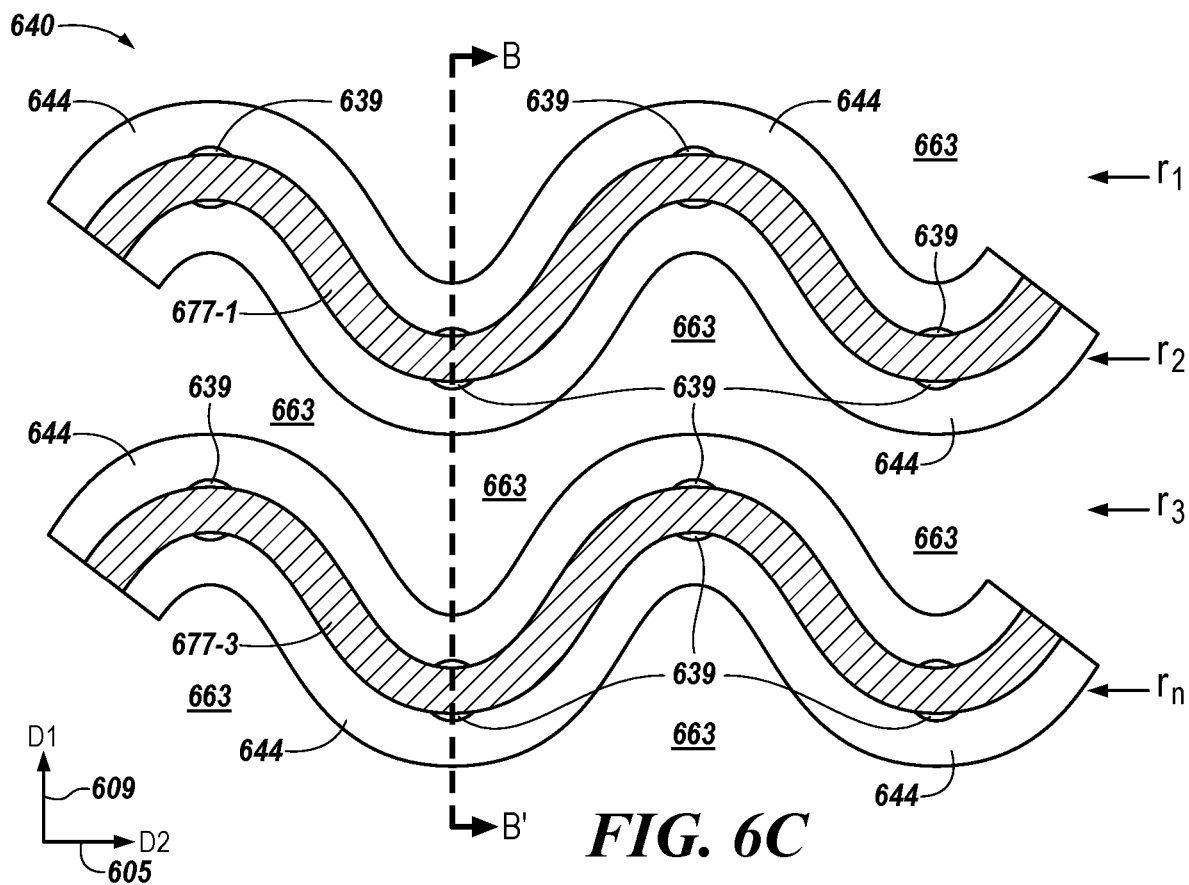

FIG. 6C illustrates an additional step in a process of forming twisted conductive lines of a semiconductor memory device in accordance with a number of embodiments of the present disclosure. As illustrated in FIG. 6C, a dielectric material 644 may be formed adjacent to each conductive line 677 (i.e., 677-1, 677-3 formed onto conductive contacts 639) on either side (i.e., adjacent to conductive line 677 in both horizontal direction 605 and horizontal direction 609). Another dielectric material 663 may be formed over and around the conductive lines 677. Dielectric materials 644 and 663, as well as any other dielectric materials described in this disclosure, may include, for example: a nitride material, an oxide material, or a combination of such materials.

Dielectric material 644 may be a spacer material isolating the already formed conductive lines 677 from other dielectric materials (e.g., dielectric 663) during the process of conductive line formation described herein.

Figure 6D:
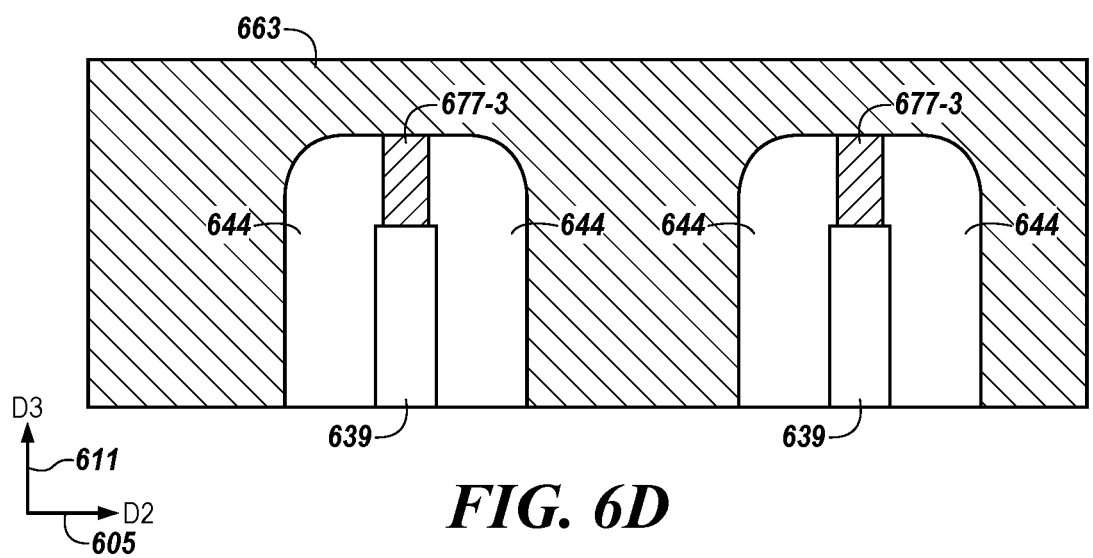

FIG. 6D is a cross-sectional view along line 'B' of FIG. 6C. As shown in FIG. 6D, conductive lines 677 (i.e., 677-3) may be formed onto conductive line contacts 639. The first dielectric 644 may be deposited on either side of the conductive contacts 639 and conductive lines 677. The second dielectric 663 may be deposited over and around the conductive lines 677, filling any spaces between conductive lines 677 and forming a layer of dielectric material 663 above conductive lines 677.

Figure 6E:
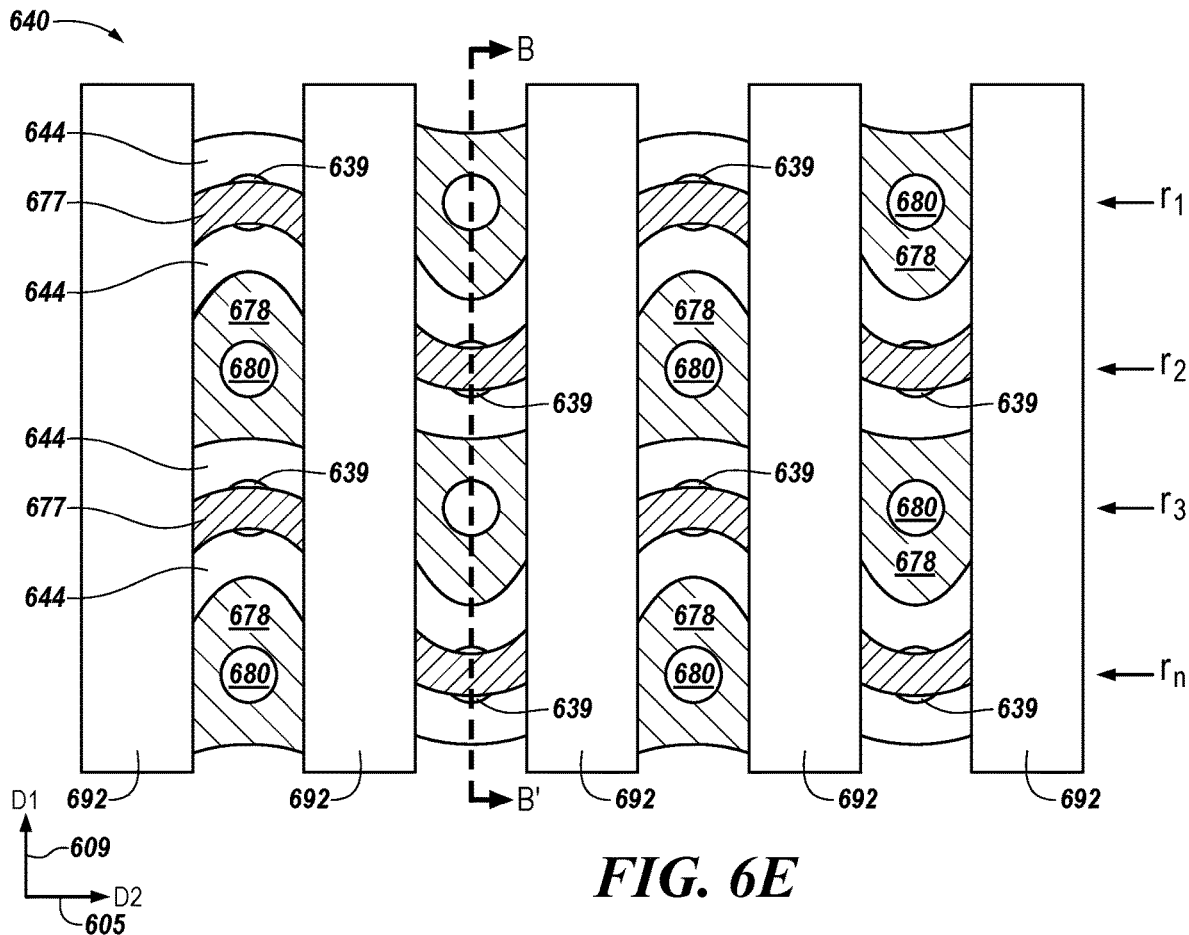

FIG. 6E illustrates another step in a process of forming twisted conductive lines of a semiconductor memory device in accordance with a number of embodiments of the present disclosure. As shown in FIG. 6E, one or more layers of a hard mask material 692 (e.g., photoresist layers) may be formed between conductive contacts 639 and extending in a horizontal direction 609. The hard mask material 692 may serve to protect portions of the conductive lines 677 and portions of dielectric material deposits 644, 663 (not shown), and 678 during subsequent processing steps described below (e.g., conductive contact and twisted conductive line formation steps). In other words, the hard mask material 692 may serve as a protective layer to keep the portions 640 of the semiconductor memory device that are not being removed intact during the removal process.

The second dielectric 663 may be etched from the regions between the first dielectric 644 and the hard mask material 692. A third dielectric 678 may be formed over the memory cell array 640 such that the third dielectric 678 fills the spaces between the first dielectric 644 and the hard mask layers 692, which were previously occupied by the second dielectric 663. As such, the third dielectric 678 may occupy regions adjacent to the first dielectric 644. Although FIG. 6E does not show the second dielectric material 663 of FIGS. 6C and 6D, embodiments of the present disclosure are not limited to those in which the second dielectric material 663 is completely removed at this stage of the process. For example, the second dielectric material 663 may remain intact underneath the hard mask layers 692.

The third dielectric 678 may be selectively etched and planarized to form one or more vertical openings 680. As shown in FIG. 6E, the vertical openings 680 may be aligned with the conductive contacts 639 such that each vertical opening 680 lies on one of the horizontal rows $r_1, \ldots, r_n$ extending in horizontal direction 605. Each vertical opening 680 may also be adjacent to a conductive contact 639 in a horizontal direction 609. Since the third dielectric 678 occupies space above the conductive lines 677 already formed, the vertical openings 680 may be longer than the conductive contacts 639.

Figure 6F:
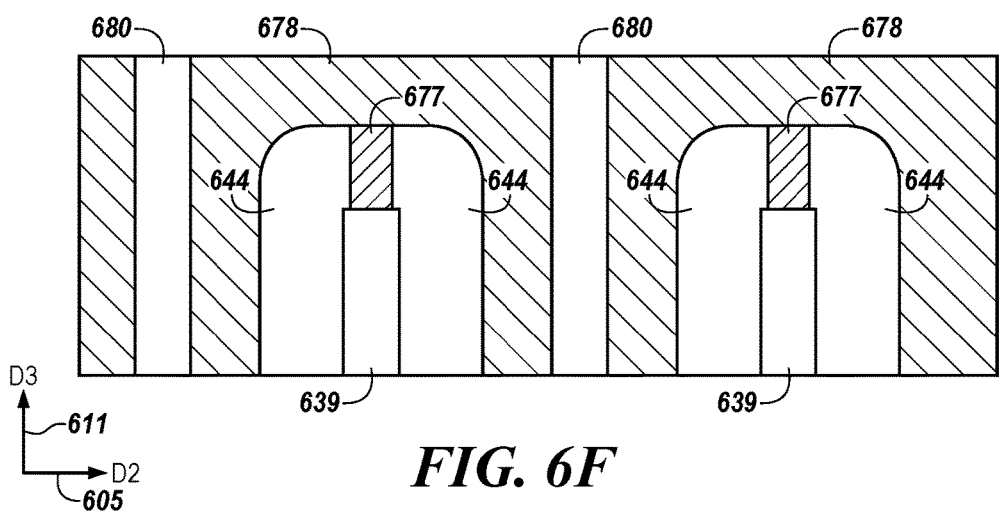

FIG. 6F is a cross-sectional view of the FIG. 6E along line 'B'. As shown in FIG. 6E, the first dielectric material 644 adjacent to the conductive lines 677 on either side may remain intact. The third dielectric material 678 may be deposited adjacent to and above the first dielectric material 644. Like the hard mask material 692, the third dielectric 678 may include a material suitable for protecting and keeping conductive lines 677 intact during subsequent steps of the processes described herein. The third dielectric material 678 may be selectively etched to form vertical openings 680 which are aligned with conductive contacts 639 in two horizontal directions (i.e., horizontal directions 605 and 609 of FIG. 6E).

Figure 6G:
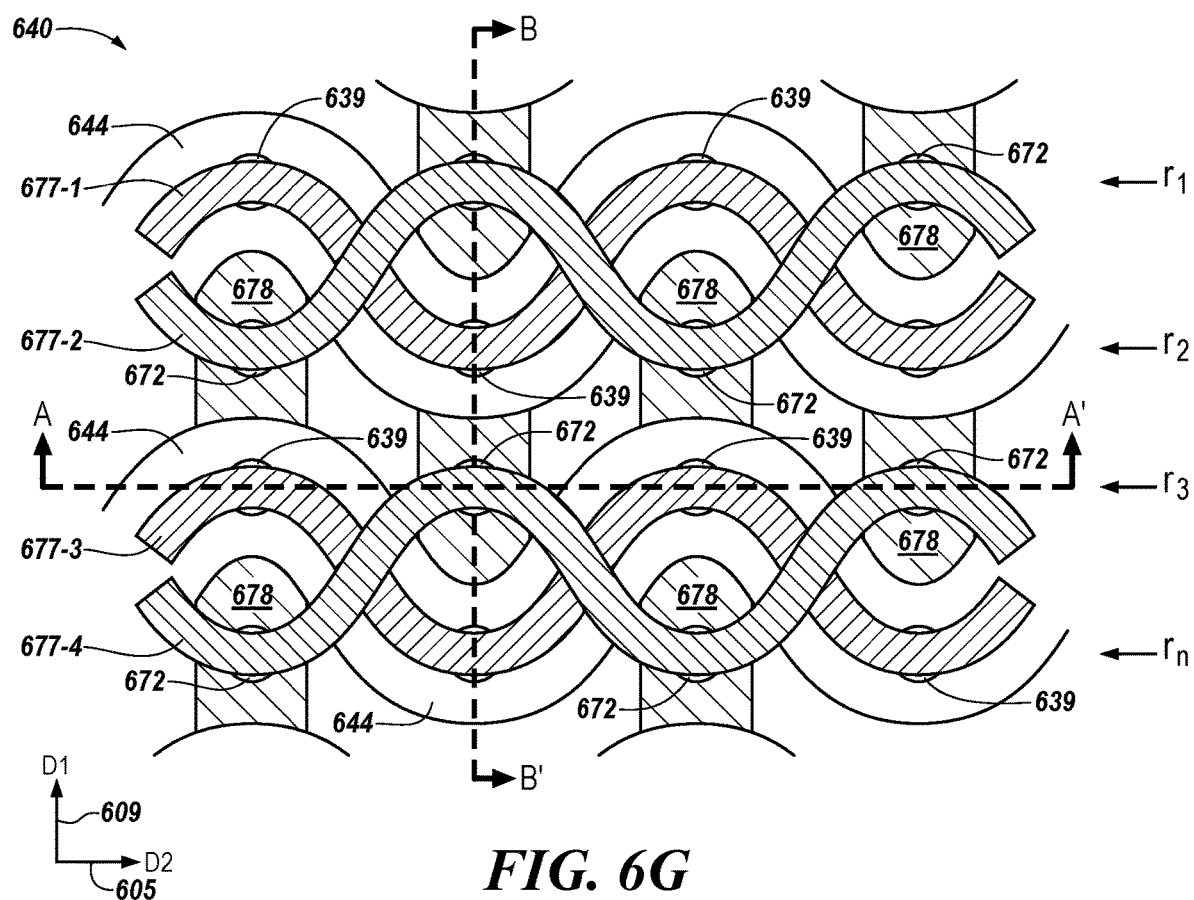

FIG. 6G illustrates an additional step in a process of forming twisted conductive lines of a semiconductor memory device in accordance with a number of embodiments of the present disclosure. The hard mask material 692 of FIG. 6E may be removed from the portion 640 of the memory cell array of the semiconductor memory device. A conductive material may be formed into each of the vertical openings 680 of dielectric 678 shown in FIGS. 6E and 6F to form a second number of conductive contacts 672. The conductive contacts 672 may be greater in height (i.e., vertical length) than conductive contacts 639. Upper conductive lines 677-2 and 677-4 may be formed onto conductive contacts 672. Thus, upper conductive lines 677-2 and 677-4 may be vertically above lower conductive lines 677-1 and 677-3. Upper conductive lines 677-2 and 677-4 may also lie above dielectric 644. Like lower conductive lines 677-1 and 677-3, upper conductive lines 677-2 and 677-4 may have one or more curved portions. In other words, each conductive contact 672 may be spaced from other conductive contacts 672 on a given upper conductive line (e.g., 677-2 or 677-4) in both a first horizontal direction 605 and a second, perpendicular horizontal direction 609. As described in connection with FIG. 5A, conductive lines 677 may be shaped in any matter involving multiple curved portions. For example, conductive lines 677 may be shaped as sinusoids. Upper conductive lines 677-2 and 677-4 may be shaped inversely to lower conductive lines 677-1 and 677-3. Upper conductive lines 677-2 and 677-4 may make contact with each conductive contact 672 of two adjacent rows $r_n$ and $r_{n-1}$.

Conductive lines 677 may be formed within arrays of vertically stacked memory cells of the semiconductor memory device. For example, a method of forming an array of vertically stacked memory cells may comprise forming a number of layers, each layer comprising at least one of a conductive material and a dielectric material. Conductive lines 677 may be formed within a layer of dielectric material, or conductive contacts 639 or 672 may make contact with a layer of dielectric material. Conductive lines 677 and/or conductive contacts 639 and 672 may also make contact with other components of the semiconductor memory device (e.g., any of the components described in connection with FIG. 5A).

In one method embodiment, the method for forming conductive lines within arrays of vertically stacked memory cells, includes: forming a first row and a second row of a first number of vertical conductive line contacts, wherein the vertical contacts in each row are arrayed in a first horizontal direction and the first row is spaced from the second row in a second horizontal direction; forming a first number of conductive lines with one or more curved portions, each conductive line making contact with alternating ones of the conductive line contacts of the first and second rows of the first number of vertical conductive line contacts; and forming a second number of conductive lines with one or more curved portions, each conductive line making contact with the remaining ones of the conductive line contacts of the first and second rows of the first number of vertical conductive line contacts that have not been contacted by the first number of conductive lines. In such an embodiment, the vertical conductive line contacts can be evenly spaced or unevenly spaced, as discussed in more detail below.

Although FIG. 6G illustrates four conductive lines 677-1, . . . , 677-4, embodiments of the present disclosure are not so limited. For example, semiconductor devices in accordance with the present disclosure may include greater or fewer numbers of conductive lines 677. Additionally, although FIG. 6G illustrates conductive lines 677 formed upon four conductive contacts 639 or 672, embodiments of the present disclosure are not so limited. For example, conductive lines 677 in accordance with the present disclosure may be formed on a greater or fewer number of conductive contacts 672 or 639.

Additionally, the individual conductive contacts 672 or 639 shown in FIG. 6G may be replaced with multiple (e.g., pairs) conductive contacts. In other words, in each location for each conductive contact 672 or 639 shown in FIG. 6G, two or more conductive contacts may be used that are proximate one another. For example, in some such embodiments, a pair of contacts may be positioned a first lateral distance apart from each other and the pair may be positioned a second, larger, lateral distance away from an adjacent pair of contacts.

Each of the multiple contacts may extend vertically and parallel to vertical digit lines or access lines of the memory cell array. Further, when pairs of contacts are used, in some embodiments, one of the contacts may extend vertically on one side and the other contact may extend vertically on the other side of a vertical digit line or access line of the memory cell array.

Furthermore, although FIG. 6G illustrates conductive contacts 672 and 639 being evenly spaced from other conductive contacts 672 or 639 in a given row $r_1, \ldots, r_n$, embodiments of the present disclosure are not so limited. Conductive contacts 639 and 672 along a given row $r_1, \ldots, r_n$, may be spaced unevenly. For example, the conductive contacts 639 and 672 of a given row $r_1, \ldots, r_n$, may have spacing alternating between a first lateral distance and a second lateral distance or may have an irregular distance between contacts as compared to other distances between contacts in the row.

Figure 6H:
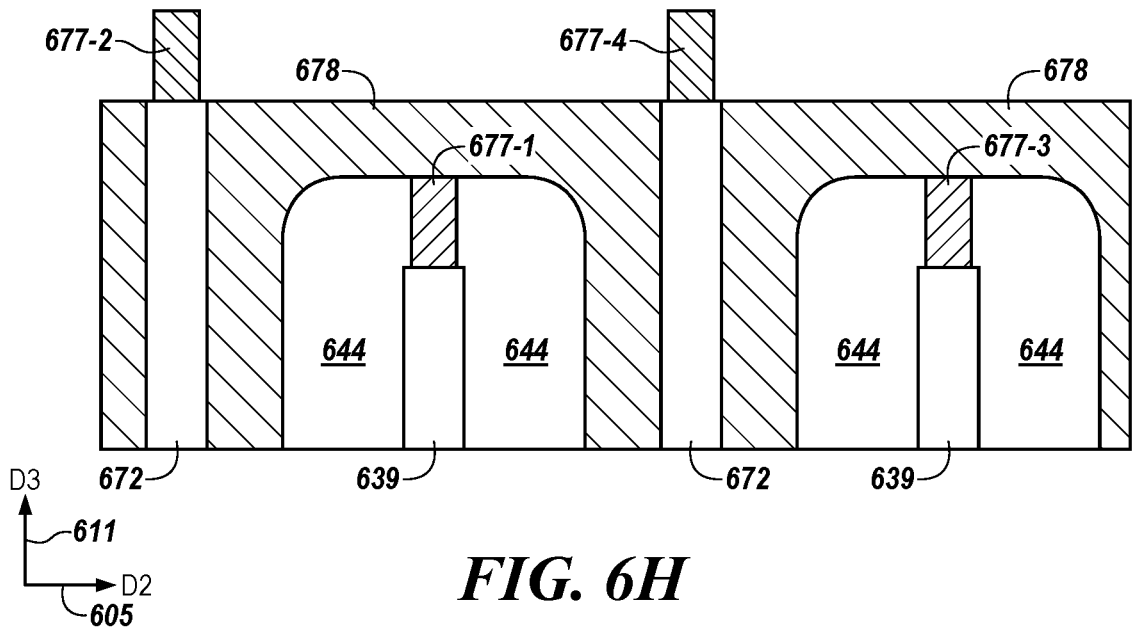

FIG. 6H is a cross-sectional view along line 'B' of FIG. 6G. As shown in FIG. 6H, conductive contacts 672 upon which upper conductive lines 677 (e.g., conductive lines 677-2 and 677-4) are formed may be of a greater length than conductive contacts 639 upon which lower conductive lines (e.g., conductive lines 677-1 and 677-3) are formed. Conductive contacts 672 and 639 may be aligned in a first direction 609 of FIG. 6G.

The first dielectric material 644 may serve to isolate the lower conductive lines 677-1 and 677-3 and the conductive contacts 639 from other elements (e.g., dielectric material 678, contacts 672, and conductive lines 677-2 and 677-4). The dielectric material 678 in which the conductive contacts 672 are formed may lie above and between the deposits of the first dielectric 644. Upper conductive lines 677-2 and 677-4 may lie above lower conductive lines 677-1 and 677-3 and the third dielectric 678.

Figure 6I:
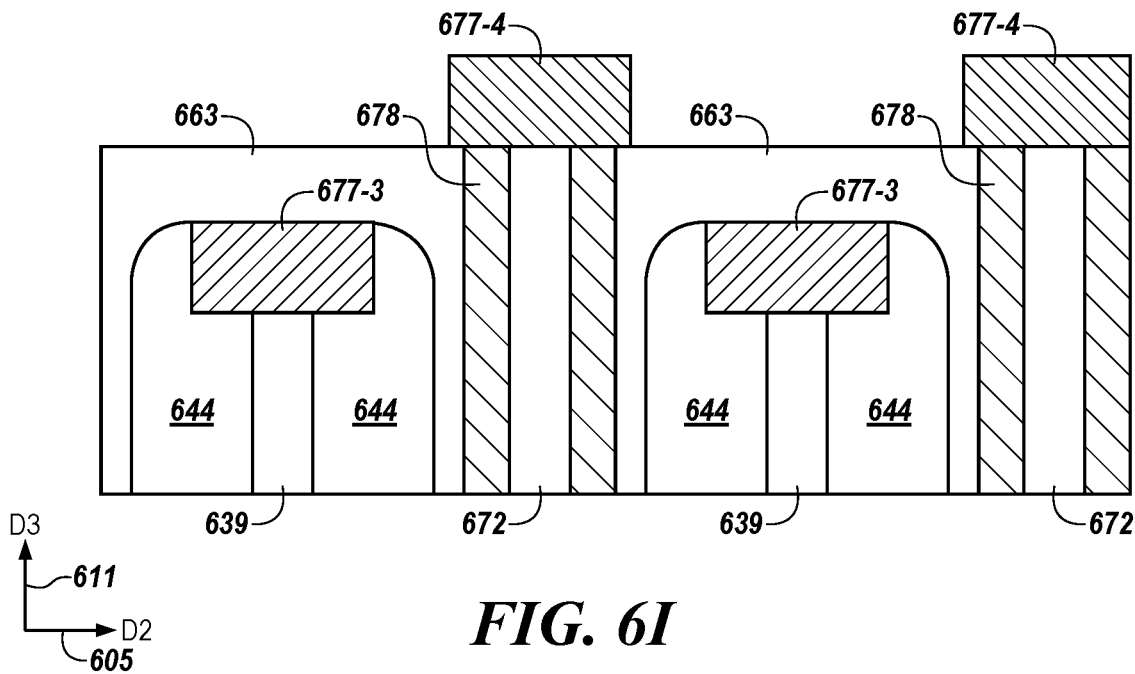

FIG. 6I is a cross-sectional view along line 'A' of FIG. 6G. As shown in FIG. 6I, conductive contacts 639 and 672 may be aligned in direction 605 but extend in a vertical direction 611. The second dielectric material 663 may be adjacent to the third dielectric material 678 and cover portions of the first dielectric material 644 and lower conductive lines (e.g., conductive line 677-3) and lie below the upper conductive lines (e.g., conductive line 677-4).

FIG. 7 is a block diagram of an apparatus in the form of a computing system including a memory device in accordance with a number of embodiments of the present disclosure. FIG. 7 is a block diagram of an apparatus in the form of a computing system 700 including a memory device 703 in accordance with a number of embodiments of the present disclosure. As used herein, a memory device 703, a memory array 710, and/or a host 702, for example, might also be separately considered an "apparatus." According to embodiments, the memory device 702 may comprise at least one memory array 710 having a three-node access device for vertical three dimensional (3D) memory, as has been described herein.

In this example, system 700 includes a host 702 coupled to memory device 703 via an interface 704. The computing system 700 can be a personal laptop computer, a desktop computer, a digital camera, a mobile telephone, a memory card reader, or an Internet-of-Things (IoT) enabled device, among various other types of systems. Host 702 can include a number of processing resources (e.g., one or more processors, microprocessors, or some other type of controlling circuitry) capable of accessing memory 703. The system 700 can include separate integrated circuits, or both the host 702 and the memory device 703 can be on the same integrated circuit. For example, the host 702 may be a system controller of a memory system comprising multiple memory devices 703, with the system controller 705 providing access to the respective memory devices 703 by another processing resource such as a central processing unit (CPU).

In the example shown in FIG. 7, the host 702 is responsible for executing an operating system (OS) and/or various applications (e.g., processes) that can be loaded thereto (e.g., from memory device 703 via controller 705). The OS and/or various applications can be loaded from the memory device 703 by providing access commands from the host 702 to the memory device 703 to access the data comprising the OS and/or the various applications. The host 702 can also access data utilized by the OS and/or various applications by providing access commands to the memory device 703 to retrieve said data utilized in the execution of the OS and/or the various applications.

For clarity, the system 700 has been simplified to focus on features with particular relevance to the present disclosure. The memory array 710 can be a DRAM array, SRAM array, STT RAM array, PCRAM array, TRAM array, RRAM array, NAND flash array, and/or NOR flash array, comprising at least one three-node access device for three dimension (3D) memory. For example, the memory array 710 can be an unshielded DL 4F2 array such as a 3D-DRAM memory array. The array 710 can comprise memory cells arranged in rows coupled by word lines (which may be referred to herein as access lines or select lines) and columns coupled by digit lines (which may be referred to herein as sense lines or data lines). Although a single array 710 is shown in FIG. 7, embodiments are not so limited. For instance, memory device 703 may include a number of arrays 710 (e.g., a number of banks of DRAM cells).

The memory device 703 includes address circuitry 706 to latch address signals provided over an interface 704. The interface can include, for example, a physical interface employing a suitable protocol (e.g., a data bus, an address bus, and a command bus, or a combined data/address/command bus). Such protocol may be custom or proprietary, or the interface 704 may employ a standardized protocol, such as Peripheral Component Interconnect Express (PCIe), Gen-Z, CCIX, or the like. Address signals are received and decoded by a row decoder 708 and a column decoder 712 to access the memory array 710. Data can be read from memory array 710 by sensing voltage and/or current changes on the sense lines using sensing circuitry 711. The sensing circuitry 711 can comprise, for example, sense amplifiers that can read and latch a page (e.g., row) of data from the memory array 710. The I/O circuitry 707 can be used for bi-directional data communication with the host 702 over the interface 704. The read/write circuitry 713 is used to write data to the memory array 710 or read data from the memory array 710. As an example, the circuitry 713 can comprise various drivers, latch circuitry, etc.

Control circuitry 705 decodes signals provided by the host 702. The signals can be commands provided by the host 702. These signals can include chip enable signals, write enable signals, and address latch signals that are used to control operations performed on the memory array 710, including data read operations, data write operations, and data erase operations. In various embodiments, the control circuitry 705 is responsible for executing instructions from the host

702. The control circuitry 705 can comprise a state machine, a sequencer, and/or some other type of control circuitry, which may be implemented in the form of hardware, firmware, or software, or any combination of the three. In some examples, the host 702 can be a controller external to the memory device 703. For example, the host 702 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The term dielectric can refer to, for example, a material comprising any combination of an oxide material and/or a nitride material.

Conductive lines formed using the processes described herein can have several benefits. For example, the processes described herein may allow for conductive lines to be formed in closer proximity without creating excessive noise, parasitic capacitance, or connectivity issues. This may ease spatial restraints, reduce the surface area, and improve the overall performance of the memory device.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming conductive lines within arrays of vertically stacked memory cells, comprising:
   forming a first row and a second row of a first number of vertical conductive line contacts, wherein the vertical contacts in each row are arrayed in a first horizontal direction and the first row is spaced from the second row in a second horizontal direction;
   forming a first number of conductive lines with one or more curved portions, each conductive line making contact with alternating ones of the conductive line contacts of the first and second rows of the first number of vertical conductive line contacts; and
   forming a second number of conductive lines with one or more curved portions, each conductive line making contact with the remaining ones of the conductive line contacts of the first and second rows of the first number of vertical conductive line contacts that have not been contacted by the first number of conductive lines.

2. The method of claim 1, further comprising forming a number of deposits of a first dielectric adjacent on either side of each of the first number of conductive lines and forming a second dielectric between each deposit of the first dielectric.

3. The method of claim 2, further comprising forming a second number of vertical conductive line contacts by:
   forming a number of vertical openings by selectively etching the second dielectric, wherein the number of vertical openings are aligned with the first number of conductive line contacts; and
   forming a conductive material into each of the number of vertical openings.

4. The method of claim 3, further comprising forming a third number of horizontal conductive lines with one or more curved portions, each conductive line of the third number of conductive lines making contact with each conductive line contact of two adjacent rows of the second number of conductive line contacts.

5. The method of claim 3, wherein the second number of conductive line contacts are longer than the first number of conductive line contacts.

6. The method of claim 1, further comprising forming one or more masks perpendicular to the rows of the first number of conductive line contacts and between the first number of conductive line contacts before depositing a second dielectric material.

7. The method of claim 1, wherein the first number of conductive lines are shaped as sinusoids.

8. The method of claim 1, wherein the second conductive lines are shaped inversely to the first number of conductive lines.

9. A method for forming conductive lines within arrays of vertically stacked memory cells, comprising:
- forming a number of layers, each layer comprising at least one of a conductive material and a dielectric material;
- forming a first row and a second row of a first number of vertically oriented conductive line contacts, wherein the vertical contacts in each row are arrayed in a first horizontal direction and the first row is spaced from the second row in a second horizontal direction;
- forming a first number of horizontally oriented conductive lines with one or more curved portions, each conductive line making contact with alternating ones of the conductive line contacts of the first and second rows of the first number of conductive line contacts and with one or more layers of the number of layers; and
- forming a second number of conductive lines with one or more curved portions, each conductive line making contact with the remaining ones of the conductive line contacts of the first and second rows of the first number of vertical conductive line contacts that have not been contacted by the first number of conductive lines.

10. The method of claim 9, further comprising;
- forming a number of deposits of a first dielectric on either side of the first number of conductive lines; and
- forming a second dielectric material between each deposit of the first dielectric.

11. The method of claim 10, further comprising forming a second number of vertical conductive line contacts by:
- forming a number of vertical openings by selectively etching the second dielectric, wherein the number of vertical openings are aligned with the first number of conductive line contacts; and
- forming a conductive material into each of the second number of vertical openings.

12. The method of claim 11, further comprising forming a third number of horizontally oriented conductive lines with one or more curved portions, each of the third number of conductive lines making contact with each conductive line contact of two adjacent rows of the second number of conductive line contacts and with one or more layers of the number of layers.

13. The method of claim 9, wherein each conductive line comprises a metal material.

14. The method of claim 9, wherein the first dielectric material acts as a spacer.

15. A semiconductor memory device, comprising:
- an array of vertically stacked memory cells, comprising:
  - a horizontal array of conductive line contacts, wherein:
    - a first row and a second row of a first number of vertical conductive line contacts are arrayed in a first horizontal direction and the first row is spaced from the second row in a second horizontal direction;
  - a first horizontal conductive line with one or more curved portions making contact with alternating ones of the first and second rows of the first number of vertical conductive line contacts; and
  - a second horizontal conductive line above the first conductive line with one or more curved portions, each conductive line making contact the remaining ones of the conductive line contacts of the first and second rows of the first number of vertical conductive line contacts that have not been contacted by the first horizontal conductive line.

16. The semiconductor device of claim 15, wherein the vertical contacts contacted by the second conductive line are vertically longer than the ones contacted by the first conductive line.

17. The semiconductor device of claim 15, further comprising a deposit of dielectric material adjacent to the first conductive line.

18. The semiconductor device of claim 15, wherein each conductive line contact makes contact with a substrate of a memory cell.

19. The semiconductor device of claim 15, wherein the vertical conductive line contacts of the first row of the first number of vertical conductive line contacts arrayed in the first horizontal direction are spaced unevenly with respect to each other.

20. The semiconductor memory device of claim 15, wherein the semiconductor memory device is a three-dimensional (3D) dynamic random-access memory device.

* * * * *